(12) United States Patent
Mahgerefteh et al.

(10) Patent No.: US 12,125,865 B2
(45) Date of Patent: Oct. 22, 2024

(54) ELECTROMAGNETIC RADIATION DETECTORS INTEGRATED WITH IMMERSION LENSES

(71) Applicant: Apple Inc., Cupertino, CA (US)

(72) Inventors: Daniel Mahgerefteh, Campbell, CA (US); Mark Alan Arbore, Los Altos, CA (US); Matthew T. Morea, Cupertino, CA (US); Romain F. Chevallier, Santa Clara, CA (US); Yung-Yu Hsu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 404 days.

(21) Appl. No.: 17/464,550

(22) Filed: Sep. 1, 2021

(65) Prior Publication Data

US 2022/0320168 A1 Oct. 6, 2022

Related U.S. Application Data

(60) Provisional application No. 63/169,101, filed on Mar. 31, 2021.

(51) Int. Cl.
| | | |
|---|---|---|
| *H01L 31/00* | (2006.01) | |
| *G01J 5/0808* | (2022.01) | |
| *H01L 27/146* | (2006.01) | |
| *H01L 31/0232* | (2014.01) | |

(52) U.S. Cl.
CPC ...... *H01L 27/14625* (2013.01); *G01J 5/0808* (2022.01); *H01L 27/1464* (2013.01); *H01L 27/14649* (2013.01); *H01L 31/02327* (2013.01)

(58) Field of Classification Search
CPC ........... H01L 31/0232; H01L 31/02327; H01L 27/14625; H01L 27/14649
See application file for complete search history.

(56) References Cited

U.S. PATENT DOCUMENTS

| | | |
|---|---|---|
| 4,042,821 A | 8/1977 | Mierzwinski |
| 5,479,032 A | 12/1995 | Forrest |
| 7,135,698 B2 | 11/2006 | Mitra |
| 7,244,924 B2 | 7/2007 | Kiyomoto et al. |
| 7,999,231 B2 | 8/2011 | Iguchi et al. |
| 8,816,415 B2 | 8/2014 | Liu et al. |
| 8,816,461 B2 | 8/2014 | Yuan et al. |
| 8,969,208 B2 | 3/2015 | Nishimoto et al. |
| 9,000,372 B2 | 4/2015 | Tsuchiya |

(Continued)

FOREIGN PATENT DOCUMENTS

| | | |
|---|---|---|
| AU | 2018269000 | 1/2020 |
| JP | H09270527 | 10/1997 |
| WO | WO 18/088083 | 5/2018 |
| WO | WO 18/187370 | 10/2018 |
| WO | WO 20/072458 | 4/2020 |

OTHER PUBLICATIONS

Invitation to Pay Additional Fees dated Jan. 25, 2022, PCT/US2021/048978, 10 pages.

(Continued)

*Primary Examiner* — Reema Patel
(74) *Attorney, Agent, or Firm* — Brownstein Hyatt Farber Schreck, LLP

(57) ABSTRACT

An electromagnetic radiation detector pixel includes a set of epitaxial layers and a lens. The set of epitaxial layers defines an electromagnetic radiation absorber. The lens is directly bonded to the set of epitaxial layers.

14 Claims, 15 Drawing Sheets

(56) References Cited

U.S. PATENT DOCUMENTS

| | | |
|---|---|---|
| 9,817,199 B2 | 11/2017 | Sherrer |
| 9,825,073 B2 | 11/2017 | Webster |
| 9,923,114 B2 | 3/2018 | de Lyon et al. |
| 10,344,328 B2 | 7/2019 | Barbee et al. |
| 10,374,072 B2 | 8/2019 | Nuzzo et al. |
| 10,375,282 B2 | 8/2019 | Ishida et al. |
| 10,462,402 B2 | 10/2019 | Fan |
| 10,644,187 B2 | 5/2020 | Chen et al. |
| 10,687,718 B2 | 6/2020 | Allec et al. |
| 10,808,150 B2 | 10/2020 | Kato et al. |
| 10,963,104 B2 | 3/2021 | Bergström et al. |
| 11,158,757 B2 | 10/2021 | Lin et al. |
| 2015/0102448 A1* | 4/2015 | Sato .............. H01L 27/1469 257/446 |
| 2019/0319055 A1 | 10/2019 | Zaizen et al. |
| 2022/0037543 A1 | 2/2022 | Arbore et al. |
| 2022/0397651 A1 | 12/2022 | Murase et al. |

OTHER PUBLICATIONS

Piotrowski, "Recent progress in uncooled photodetection of the mid-infrared radiation," Communications and Photonics Conference (ACP), 2012, Asia, IEEE, Nov. 7, 2012, pp. 1-6.
Jakšić et al., "Plasmonic Enhancement of Light Trapping in Photodetectors," *Facta Universitatis*, Series: Electronics and Energetics, vol. 27, No. 2, Jun. 2014, pp. 183-203.
Ma et al., Plasmonically Enhanced Graphene Photodetector Featuring 100 Dbit/s Data Reception, High Responsivity, and Compact Size, *ACS Photonics*, 2019, vol. 6, pp. 154-161.
Zhou et al., "Direct nearfield optical imaging of UV bowtie nanoantennas," *Optics Express*, vol. 17, Issue 22, 2009, pp. 20301-20306.
International Search Report and Written Opinion dated Mar. 18, 2022, PCT/US2021/048978, 17 pages.
Sun et al., "Performance of dual-band short- or mid-wavelength infrared photodetectors based on InGaAsSb bulk materials and InAs/GaSb superlattices," Chin. Phys. B., vol. 26, No. 9, 2017, pp. 098506-1-098506-4.

\* cited by examiner

ELECTROMAGNETIC RADIATION DETECTORS INTEGRATED WITH IMMERSION LENSES

CROSS-REFERENCE TO RELATED APPLICATION

This application is a nonprovisional of, and claims the benefit under 35 U.S.C. § 119(e) of, U.S. Provisional Patent Application No. 63/169,101, filed Mar. 31, 2021, the contents of which are incorporated herein by reference as if fully disclosed herein.

FIELD

The described embodiments relate to the detection of electromagnetic radiation and, more particularly, to electromagnetic radiation detectors integrated with immersion lenses.

BACKGROUND

Sensors are included in many of today's electronic devices, including electronic devices such as smartphones, computers (e.g., tablet computers or laptop computers), wearable electronic devices (e.g., electronic watches, smart watches, or health monitors), game controllers, navigation systems (e.g., vehicle navigation systems or robot navigation systems), and so on. Sensors may variously sense the presence of objects, distances to objects, proximities of objects, movements of objects (e.g., whether objects are moving, or the speed, acceleration, or direction of movement of objects), compositions of objects, and so on. One useful type of sensor is the electromagnetic radiation detector.

SUMMARY

Embodiments of the systems, devices, methods, and apparatus described in the present disclosure are directed to electromagnetic radiation detectors having one or more electromagnetic radiation detector pixels ("detector pixels") and, more particularly, to electromagnetic radiation detectors integrated with immersion lenses. An individual detector pixel of an electromagnetic radiation detector may be integrated with an immersion lens in a one-to-one relationship or, alternatively, in a many-to-one or one-to-many relationship. Some of the described embodiments are directed to front-side illumination (FSI) electromagnetic radiation detectors that are integrated with immersion lenses, and some of the described embodiments are directed to back-side illumination (BSI) electromagnetic radiation detectors that are integrated with immersion lenses.

A common aspect of the disclosed embodiments is that a lens (an immersion lens) may be directly bonded to a layer of material forming part of the electromagnetic radiation detector. As used herein, a "direct bond" is a bond that does not rely on or otherwise use an adhesive, but is instead a molecular or chemical bond (i.e., a non-adhesive bond).

Some of the electromagnetic radiation detectors described herein are configured for short-wave infrared (SWIR) electromagnetic radiation detection and use indium gallium arsenide (InGaAs) electromagnetic radiation absorbers. However, the techniques described herein with respect to SWIR electromagnetic radiation detection and/or InGaAs electromagnetic radiation absorbers are applicable to electromagnetic radiation detectors configured for other wavelength detection ranges and/or for other electromagnetic radiation detectors that use other types of electromagnetic radiation absorbers.

In a first aspect, the present disclosure describes an electromagnetic radiation detector pixel. The electromagnetic radiation detector pixel may include a set of epitaxial layers and a lens. The set of epitaxial layers may define an electromagnetic radiation absorber. The lens may be directly bonded to the set of epitaxial layers.

In a second aspect, the present disclosure describes a front-side illumination (FSI) electromagnetic radiation detector pixel. The FSI electromagnetic radiation detector pixel may include an indium gallium arsenide (InGaAs) electromagnetic radiation absorber, and a stepped electrical contact on the InGaAs electromagnetic radiation absorber. The stepped electrical contact may have a first surface offset from a second surface, with the first surface and the second surface facing a same direction. A silicon (Si) lens may be directly bonded to the first surface. A set of one or more bond-facilitating layers may be disposed between the first surface and the lens. The bond-facilitating layer(s) may include a layer of silicon dioxide ($SiO_2$). A conductor may be disposed between the InGaAs electromagnetic radiation absorber and the lens, and may be in electrical contact with the stepped electrical contact.

In a third aspect, the present disclosure describes a back-side illumination (BSI) electromagnetic radiation detector pixel. The BSI electromagnetic radiation detector pixel may include a layered structure. The layered structure may have a first side and a second side, with the second side opposite the first side. An electromagnetic radiation absorber may be grown on the first side of the layered structure. A lens may be directly bonded to the second side of the layered structure. Electromagnetic radiation received through the lens may propagate through the layered structure to the electromagnetic radiation absorber.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1:
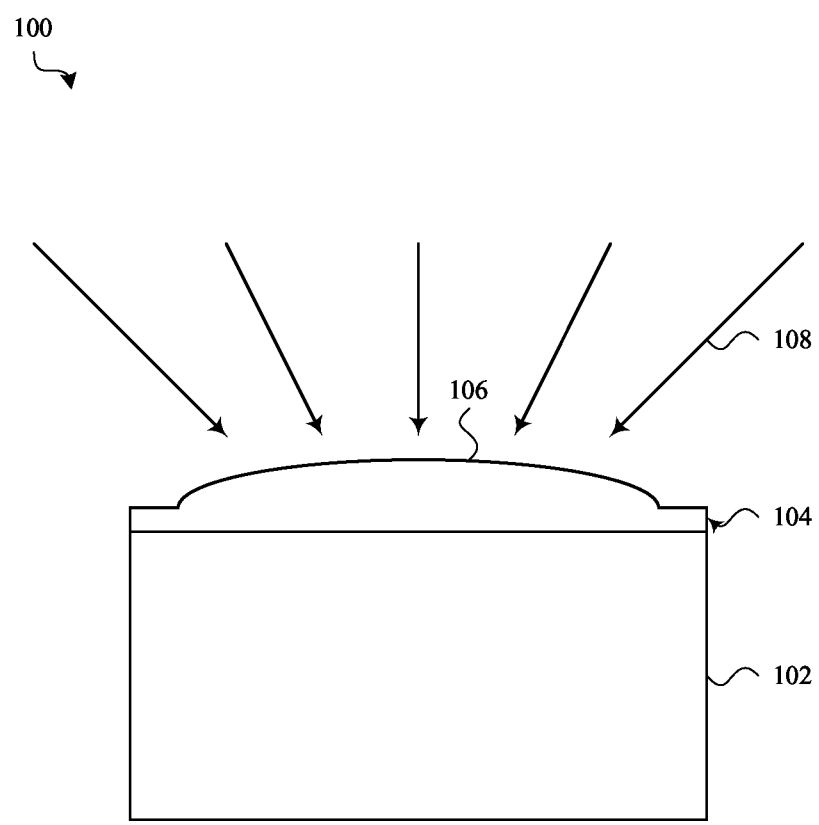
FIG. 1 shows an example cross-sectional elevation of an electromagnetic radiation detector pixel having a set of layers.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof), and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

When detecting low levels of electromagnetic radiation using an electromagnetic radiation detector pixel, shot noise from dark current can degrade the signal-to-noise ratio (SNR) of the detector pixel's desired photocurrent. The desired photocurrent is proportional to the number of photons collected and scales (but not necessarily proportionally) with the area of the detector pixel. Hence, reducing the area of the detector pixel decreases the dark current. However, decreasing the area of the detector pixel tends to decrease the number of photons that can potentially be collected (e.g., by reducing the collection area of the detector pixel), and thus also decreases the desired photocurrent, which can offset some or all of the SNR gain achieved by reducing the dark current. To increase the number of photons that can potentially be collected by a smaller detector pixel, a lens (e.g., a condenser lens) may be placed over the detector pixel to focus photons received within a larger area onto a smaller collection area (i.e., onto a detector pixel having a smaller collection area).

In some cases, a lens (e.g., a condenser lens) may be formed directly on a detector pixel by etching the lens into a layer of the detector pixel. For example, a lens may be etched into the substrate of a backside illumination (BSI) detector pixel. However, in some cases it may be desirable to form a lens apart from a detector pixel and then attach the lens to the detector pixel. Forming the lens apart from the detector pixel may provide various benefits. For example, forming the lens apart from the detector pixel allows the lens to be made from a different material than the material(s) that may be available in the detector pixel stack. A different lens material, having a higher refractive index, may allow the lens to condense more electromagnetic radiation. A different lens material may also lower the cost of a lens or improve its manufacturability (e.g., a silicon (Si) lens may be easier to manufacture than an indium phosphide (InP) lens), without significantly impacting the material decisions for the rest of the detector pixel.

In a BSI detector pixel that includes one or more buffer layers (e.g., layers which are configured to transition the lattice constant between that of the substrate and of an electromagnetic radiation absorber), the presence of the buffer layers can negatively impact the performance of the BSI detector pixel. Specifically, the defects typically found in the buffer layer(s) increase the dark current within the detector, and the buffer layer(s) may absorb electromagnetic radiation of a desired wavelength (i.e., electromagnetic radiation that would otherwise be absorbed by an intended electromagnetic radiation absorber) in a manner that cannot be captured by the detector pixel (and thus is lost for purposes of SNR). If a lens is formed on the BSI detector pixel's substrate, the buffer layer(s) cannot be removed. However, when a lens is formed apart from the detector pixel, the buffer layer(s) and the substrate on which they are formed may be partially or completely removed before the lens is attached to the back side of the detector pixel (thereby reducing the SNR loss that would otherwise result from the presence of the buffer layer(s)). Of note, the separately formed lens may be made using the same material(s) that are used in other layers of the detector pixel (e.g., the same material used to form the detector pixel's now removed substrate), but the lens may be incorporated into the detector pixel stack closer to an intended electromagnetic radiation absorber, and electromagnetic radiation does not have to travel through as great a depth of buffer layer(s). The presence of an air gap between a lens and a detector pixel's collection surface may result in a reduction of position/incident angle pairs of electromagnetic radiation (e.g., combinations of lateral locations and incident angles of electromagnetic radiation on the surface of the lens) that will reach the collection surface of the detector pixel (e.g., because of total internal reflection (TIR)). To focus electromagnetic radiation arriving at a large range of position/incident angle pairs onto a small detector pixel (i.e., a detector pixel having a small area collection surface), an immersion lens (i.e., a lens that is attached to the detector pixel without an air gap) may be adhesively bonded to the collection surface of the detector pixel, thus removing any air gap between the lens and the detector pixel's collection surface. However, for electromagnetic radiation having incident angles greater than the critical angle of the lens/adhesive interface, such electromagnetic radiation is unable to propagate across the lens/adhesive interface and may still experience TIR within the lens. To increase the range of position/incident angle pairs from which a detector pixel may collect electromagnetic radiation (i.e., to provide a detector pixel with a higher numerical aperture (NA)), the thickness of the adhesive needs to be made thinner. Unfortunately, currently available adhesives can only be made so thin. To achieve a greater numerical aperture (e.g., NA>1.0), the adhesive has to be reduced in thickness more than is currently possible, or eliminated, so that the focal point of the lens can be positioned as close as possible to the collection surface (or detection plane) of the detector pixel.

The present disclosure describes an electromagnetic radiation detector pixel having a lens (an immersion lens) directly bonded to one or more other structures of the electromagnetic radiation detector pixel (though not necessarily to a surface of an electromagnetic radiation absorber or to the material that actually collects (absorbs) photons). As previously mentioned, a "direct bond" is defined herein as a bond that does not rely on or otherwise use an adhesive, but is instead a molecular or chemical bond (i.e., a non-adhesive bond) Eliminating both air and adhesive from the interface between a detector pixel's collection surface and an attached lens increases the SNR of the detector pixel, while preserving the advantages of manufacturing the lens and remainder of the detector pixel stack separately.

The constructions and techniques described herein can be applied to electromagnetic radiation detector pixels that are tailored for the detection of various ranges of electromagnetic radiation wavelengths, or to electromagnetic radiation detector pixels that are capable of detecting a wide range of (or any) electromagnetic radiation wavelengths. Although the described techniques are described primarily with reference to wideband SWIR detector pixels, the techniques are generally applicable to all kinds of electromagnetic radiation detector pixels. Detector pixels that are configured to detect SWIR are useful because most of the electromagnetic radiation within this range of wavelengths is only minimally absorbed by atmospheric components such as water, oxygen, and carbon dioxide and, thus, this range is a good range for sensing other materials or components (e.g., particulate matter, skin, blood, and so on).

One type of electromagnetic radiation detector is an InGaAs detector. Some InGaAs detectors include a layer of InGaAs (an electromagnetic radiation absorber) that is epitaxially grown directly on a substrate (e.g., an indium phosphide (InP) substrate) in a lattice-matched configuration and used in a front side illumination (FSI) configuration. Such an electromagnetic radiation detector may have low dark current and a high SNR.

To extend the absorption range of an InGaAs detector to longer electromagnetic radiation wavelengths, a set of one or more buffer layers can be grown on a substrate, and an InGaAs layer (an electromagnetic radiation absorber) can be grown on the set of one or more buffer layers in a non-lattice-matched configuration. Such an InGaAs detector can be configured to receive electromagnetic radiation through its front side (i.e., in an FSI configuration, in which electromagnetic radiation is received by the detector without first passing through the substrate) or through its back side (i.e., in a BSI configuration, in which electromagnetic radiation is received by the detector after passing through the substrate and/or the buffer layer(s)).

Electromagnetic radiation detector pixels may also take other forms, and in some cases may include electromagnetic radiation absorbers formed of gallium arsenide (GaAs), aluminum gallium arsenide (AlGaAs), silicon (Si), germanium (Ge), mercury cadmium telluride (HgCdTe), indium arsenide (InAs), indium antimonide (InSb), indium arsenide antimonide (InAsSb), gallium antimonide (GaSb), other Type-II superlattice (T2SL) structures, or other materials or combinations of materials. These types of electromagnetic radiation absorbers, or other types, may be variously formed on InP or other types of substrates, depending on the application, and may be formed on a substrate with or without one or more buffer layers separating the electromagnetic radiation absorber from the substrate. In some cases, more than one electromagnetic radiation absorber and/or set of buffer layers may be formed on a substrate. In some embodiments, the composition of an immersion lens that is directly bonded to such material(s) may need to be formed of a material other than silicon, since silicon is only transmissive to certain wavelengths (or ranges of wavelengths) of electromagnetic radiation.

The above and other embodiments and techniques are described with reference to FIGS. 1-14. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "above", "below", "left", "right", etc. is used with reference to the orientation of some of the components in some of the figures described below. Because components in various embodiments can be positioned in a number of different orientations, directional terminology is used for purposes of defining relative positions of various structures, and not absolute positions. For example, a first structure described as being "above" a second structure and "below" a third structure is also "between" the second and third structures, and would be "above" the third structure and "below" the second structure if the stack of structures were to be flipped. Also, as used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

As used herein, a "substrate" refers to a block or mass of common material. As used herein, a "layer" refers to one or more materials that are typically, but not necessarily, parallel to the top surface and/or bottom surface of a substrate or another layer.

FIG. 1 shows an example cross-sectional elevation of an electromagnetic radiation detector pixel 100 having a set of layers 102. Some of the layers may be homogeneous, and some of the layers may be heterogeneous and subdivided into different regions having different compositions. In some cases, a portion of multiple layers may be removed (e.g., etched away), and a structure spanning multiple layers may be grown or deposited.

At least one layer in the set of layers 102 may include an electromagnetic radiation absorber (e.g., one or more materials (or material layers) that individually or collectively accumulate a charge when exposed to electromagnetic radiation 108, which charge can be measured). In some cases, the electromagnetic radiation absorber may only accumulate charge when exposed to a particular range or ranges of electromagnetic radiation wavelengths. The range of electromagnetic radiation wavelengths may in some cases include a range of SWIR electromagnetic radiation wavelengths, but may alternatively encompass a different range of electromagnetic radiation wavelengths, which different range of electromagnetic radiation wavelengths may be a range of electromagnetic radiation wavelengths that overlaps or is wholly outside the SWIR range.

In some cases, the detector pixel 100 may be configured as an FSI detector pixel. In some of these embodiments, a stepped electrical contact may be formed on an electromagnetic radiation absorber that is within the set of layers 102 and near the lens 104, and the lens 104 may be directly bonded to the stepped electrical contact. The electrical contact may be stepped (i.e., have different surfaces formed at different levels) so that an electrical connection may be made to a surface of the electrical contact without adding thickness to the interface between the lens 104 and the set of layers 102. In alternative embodiments, the electrical contact may not be stepped, and an electrical connection may be made with the electrical contact between the lens 104 and the set of layers 102. The lens 104 may in some cases be directly bonded to the stepped electrical contact without any type of intervening layer therebetween. In other cases, the lens 104 may be directly bonded to the stepped electrical contact via a set of one or more bond-facilitating layers including one or more layers of $SiO_2$ and/or one or more layers of SiN. In some cases, a $SiO_2$ fill may be used to planarize (e.g., chemically-mechanically polish) the set of layers 102 to the stepped electrical contact, and the entire bottom surface of the lens 104 may be directly bonded to the set of layers 102. In other cases, the set of layers 102 may not be planarized to the stepped electrical contact and portions of the bottom surface of the lens 104 may be disposed over one or more air gaps between the lens 104 and the set of layers 102. The lens 104 may also be directly bonded to an FSI detector pixel in other ways, and may or may not be attached to a stepped electrical contact. Examples of FSI detector pixels are described in more detail with reference to FIGS. 2-7.

In some cases, the detector pixel 100 may be configured as a BSI detector pixel. In some of these embodiments, the lens 104 may be directly bonded to an electromagnetic radiation absorber that is within the set of layers 102, or to a buffer layer between the electromagnetic radiation absorber and the lens 104, or to a substrate (e.g., an InP substrate) disposed between the lens 104 and the electromagnetic radiation absorber and/or buffer layer. The lens 104 may in some cases be directly bonded to the electromagnetic radiation absorber, buffer layer, or substrate without any type of intervening layer therebetween. In other cases, the lens 104 may be directly bonded to the electromagnetic radiation absorber, buffer layer, or substrate via a set of one or more bond-facilitating layers including one or more layers of $SiO_2$ and/or one or more layers of SiN. The lens 104 may also be directly bonded to a BSI pixel in other ways. An example of a BSI detector pixel is described in more detail with reference to FIG. 8.

In some embodiments, the lens 104 may be formed of, or include, Si. The lens 104 may have an electromagnetic radiation receiving surface 106 that is convex, has a Fresnel lens profile, or has another profile.

When the lens 104 is directly bonded to the set of layers 102 via a set of one or more bond-facilitating layers (i.e., one or more relatively thin layers that facilitate bonding without using an adhesive), the bond-facilitating layer(s) may have any thickness, but are preferably as thin as possible. By way of example, a set of one or more bond-facilitating layers consisting of layers of $SiO_2$ and/or SiN preferably has a thickness of 30 nanometers (nm) or less, although a set of one or more bond-facilitating layers consisting of layers of $SiO_2$ and/or SiN may be thicker. However, as the bond-facilitating layer(s) increase in thickness, directly bonding the lens 104 to the set of layers 102 may offer fewer and/or no advantages over adhesively bonding the lens 104 to the set of layers 102. For example, the bond-facilitating layer(s) may include one or more low index materials, and if it not kept thin, electromagnetic radiation passing through the lens at greater incident angles may experience total internal reflection (TIR) within the lens and not propagate through to a detection surface of the detector pixel 100, as might occur when using an adhesive.

In some cases, the detector pixel 100 may be incorporated into an array of detector pixels.

Figure 2:
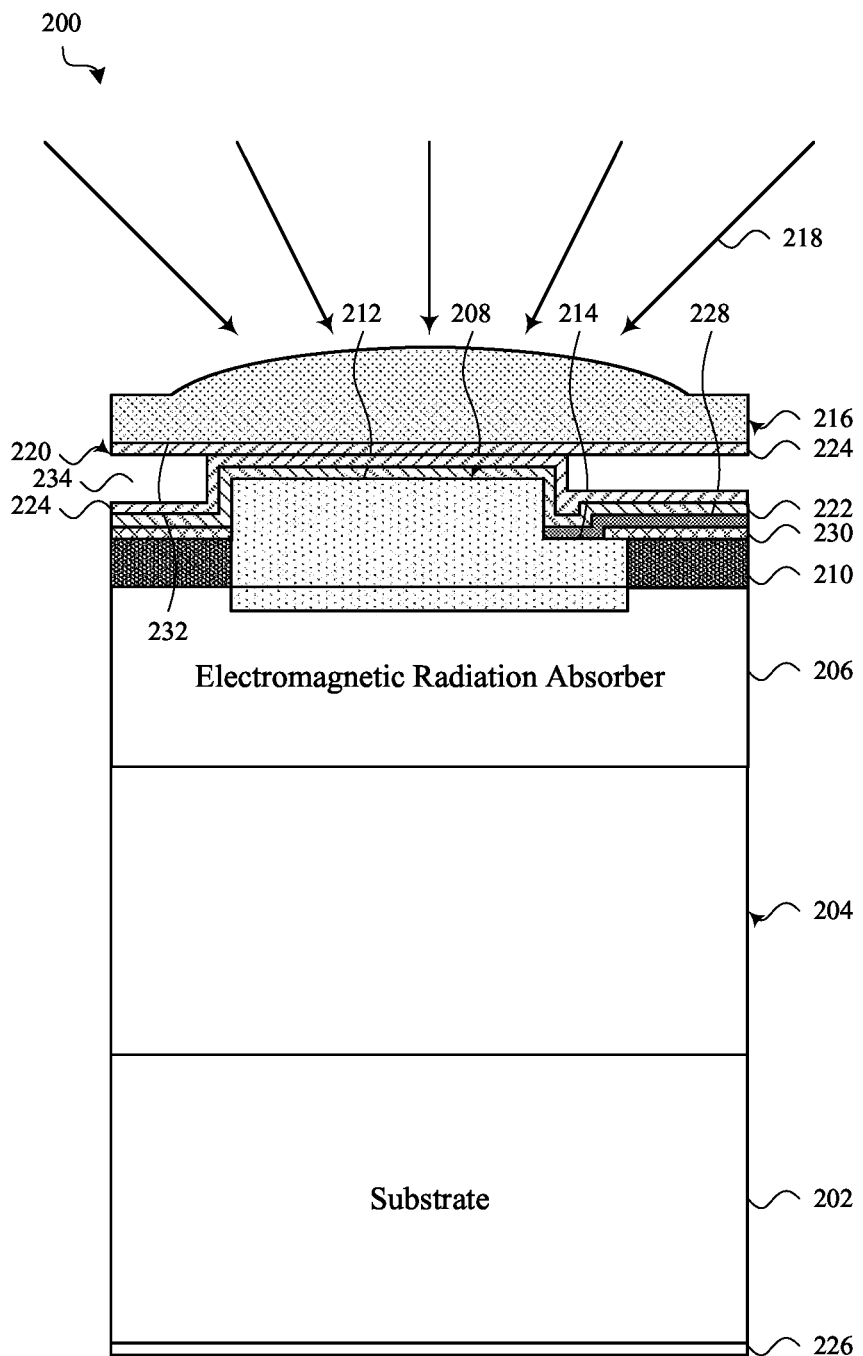
FIG. 2 shows a first example cross-sectional elevation of an FSI electromagnetic radiation detector pixel.

FIG. 2 shows a first example cross-sectional elevation of an FSI electromagnetic radiation detector pixel 200. The detector pixel 200 is an example of the detector pixel described with reference to FIG. 1. In some cases, the detector pixel 200 may be incorporated into an array of detector pixels.

The detector pixel 200 may include a substrate 202 on which a set of epitaxial layers 204 is grown. The set of epitaxial layers 204 may define an electromagnetic radiation absorber 206, which electromagnetic radiation absorber 206 may be formed from one or more materials (or one or more material layers) that individually or collectively absorb electromagnetic radiation in a manner that can be measured. The set of epitaxial layers 204 may also define a stepped electrical contact 208 on the electromagnetic radiation absorber 206. In some cases, the substrate 202 may include InP. In some cases, the electromagnetic radiation absorber 206 may include InGaAs (e.g., one or more layers of InGaAs).

The stepped electrical contact 208 may in some cases be formed by doping a layer in the set of epitaxial layers, and then etching the doped layer; for example, a portion of a cap layer 210 within the set of epitaxial layers 204. The cap layer 210 may be an upper layer in the set of epitaxial layers, and may be formed of the same or different materials as other layers in the set of epitaxial layers 204. In cases where the electromagnetic radiation absorber 206 is formed of InGaAs, the cap layer 210 may be formed of InAsP. The cap layer 210 may be diffusion-doped. In some cases, the diffusion doping may be performed using Zinc (Zn), to create a p-well (e.g., a $p^+$ well) within an n-doped cap layer 210. The cap layer 210 may also or alternatively be doped with cadmium (Cd), magnesium (Mg), manganese (Mn), or beryllium (Be). Alternatively, the cap layer 210 may be doped to create an n-well (e.g., an n– well) within a p-doped cap layer 210. The p+ well may then be etched to form a stepped electrical contact 208. The etch may be performed as a wet etch (e.g., a solution-based chemical etch) or a dry etch (e.g., a plasma-based etch). In some cases, the electromagnetic radiation absorber 206 may also be an n-doped material (e.g., an $n^-$ doped material), and the stepped electrical contact may include a p+ doped material. The differently doped electromagnetic radiation absorber 206 and stepped electrical contact 208 may form a p-n junction.

The stepped electrical contact 208 may have a number of surfaces that are parallel to the substrate 202, with a first surface 212 disposed at a first distance from the substrate 202 and a second surface 214 disposed at a second distance from the substrate 202. The second distance may be less than the first distance.

A lens 216 may be directly bonded to the first surface 212 of the stepped electrical contact 208. When the detector pixel 200 is in use, electromagnetic radiation 218 may be received through the lens 216 and then propagate through the stepped electrical contact 208, cap layer 210, and any other layers to reach the electromagnetic radiation absorber 206 (and in some cases, a portion of the electromagnetic radiation 218 may propagate through the electromagnetic radiation absorber 206 to reach one or more other layers, such as one or more other layers defining another electromagnetic radiation absorber).

By way of example, the lens 216 may include Si (and in some cases may be formed entirely of Si). In some embodiments, the lens 216 may be formed individually, or as part of a lens array, by etching a Si lens on a Si on insulator (SOI) substrate (wafer), and then removing the SOI substrate. Dry etching, wet etching, and/or gray scale lithography may be used to form a lens 216 with a desired shape. In some cases, the lens 216 may have a thickness of about 100-200 micrometers (μm).

As shown, the lens 216 may be directly bonded to the stepped electrical contact 208 via a set of one or more bond-facilitating layers 220 disposed between the first surface 212 of the stepped electrical contact 208 and the lens 216. The bond-facilitating layer(s) 220 may include one or more layers 222 of SiN on at least the first surface 212 of the stepped electrical contact 208. The bond-facilitating layer(s) 220 may also include one or more layers of $SiO_2$ 224, which layers 224 may be deposited/grown on one or both of the SiN layer 222 and/or the lens 216 prior to the lens 216 being directly bonded to the first surface 212 of the stepped electrical contact 208. Providing a layer of $SiO_2$ on both the lens 216 and the SiN layer 222 prior to bonding enables the formation of a covalent bond, having superior strength.

To reverse bias the p-n junction formed by the electromagnetic radiation absorber 206 and the stepped electrical contact 208, a first electrode 226 (or conductor) may be formed on the substrate 202, opposite the set of epitaxial layers 204, and a second electrode 228 (or conductor) may be electrically connected to the stepped electrical contact 208. The second electrode 228 may be spaced apart from the lens 216. To prevent the second electrode 228 from being unintentionally shorted to the set of epitaxial layers 204 (e.g., to the cap layer 210), a dielectric 230 (e.g., a layer of SiN) may be disposed between a portion of the second electrode 228 and a portion of the set of epitaxial layers 204, to electrically isolate the second electrode 228 from the electromagnetic radiation absorber 206 and other epitaxial layers.

In some embodiments, the stepped electrical contact 208 may be formed, and then the dielectric 230 may be deposited on the portions of the cap layer 210 that surround the stepped electrical contact 208. Another dielectric 222 (e.g., another layer 222 of SiN) may be deposited on the portions of the stepped electrical contact 208 that extend above the cap layer 210, as well as on temporarily exposed portions of the dielectric 230 and on the second electrode 228. One or more layers of SiO2 224 may then be deposited on the SiN layer 222 and/or on the bottom surface 232 of the lens 216 before the lens 216 is directly bonded to the first surface 212 of the stepped electrical contact 208.

When the lens 216 is directly bonded to the first surface 212 of the stepped electrical contact 208, a gap 234 (e.g., an air gap, other gas-filled gap, or vacuum-filled gap) may be formed between the second surface 214 of the stepped electrical contact 208 and the lens 216. The gap 234 may extend to between the dielectric 222 and the lens 216. In some embodiments, a hole may be formed in the lens material, and/or a channel may be formed in the dielectric 222 or a $SiO_2$ layer 224, to allow air or other gases to escape from the gap 234.

An advantage of the FSI detector pixel 200 is that the substrate 202 and/or set of epitaxial layers 204 (e.g., buffer layers within the set of epitaxial layers 204, such as one or more buffer layers disposed between the electromagnetic radiation absorber 206 and the substrate 202) do not need to be thinned to increase the amount of electromagnetic radiation 218 that makes it to the electromagnetic radiation absorber 206 (though the substrate 202 and/or set of epitaxial layers 204 may still be thinned if desired, to decrease the height of the detector pixel 200).

Figure 3:
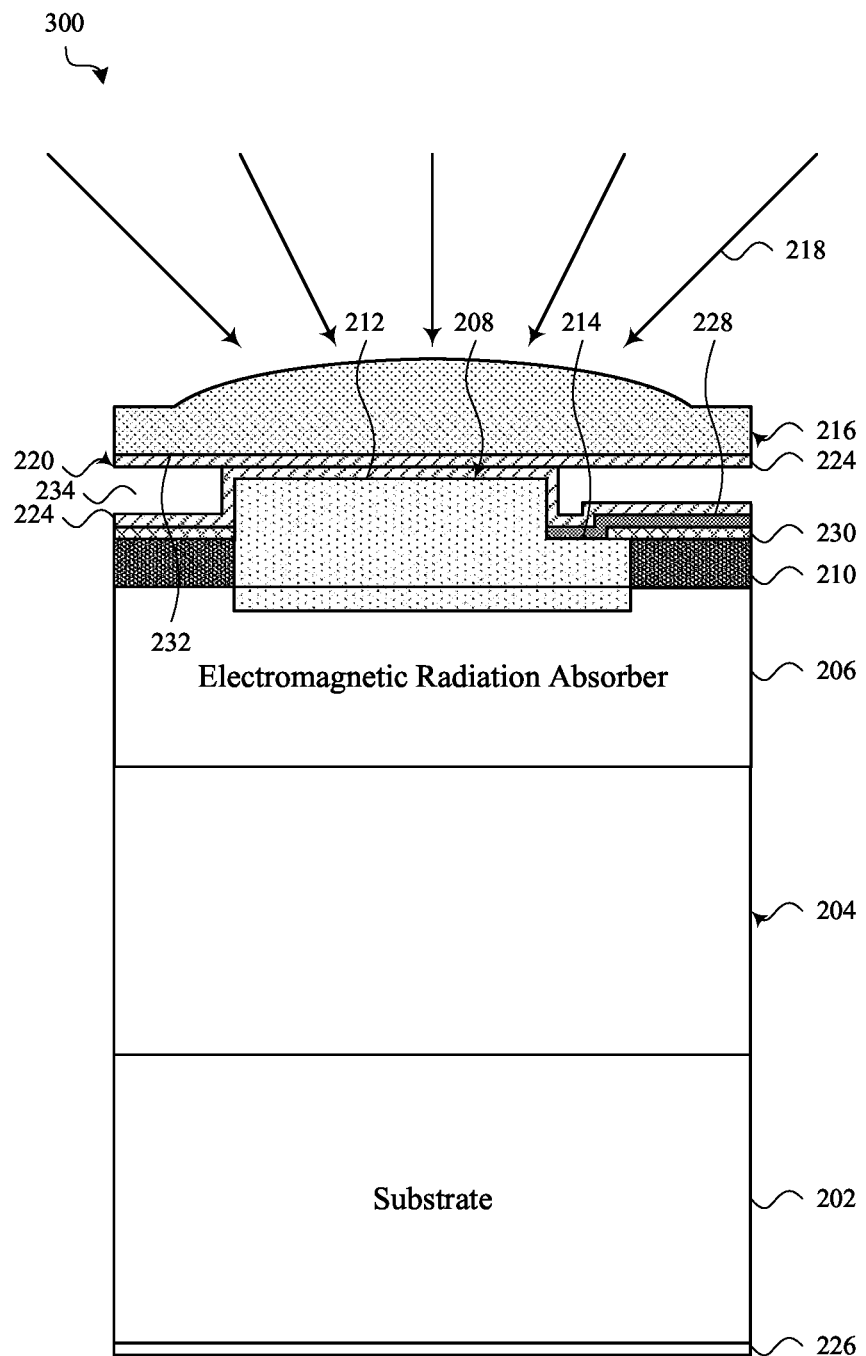
FIG. 3 shows a second example cross-sectional elevation of an FSI electromagnetic radiation detector pixel.

FIG. 3 shows a second example cross-sectional elevation of an FSI electromagnetic radiation detector pixel 300. The detector pixel 300 is an example of the detector pixel described with reference to FIG. 1 and includes much of the structure of the detector pixel described with reference to FIG. 2. In some cases, the detector pixel 300 may be incorporated into an array of detector pixels.

The detector pixel 300 differs from the detector pixel described with reference to FIG. 2 in that the set of one or more bond-facilitating layers 220 only includes the $SiO_2$ layer(s) 224. Alternatively, the bond-facilitating layer(s) 220 may only include the SiN layer(s) 222, although in the absence of a material such as $SiO_2$ on each of the lens 216 and the stepped electrical contact 208, the bond between the lens 216 and the stepped electrical contact 208 may only be a hydrogen bond (versus a covalent bond).

Figure 4:
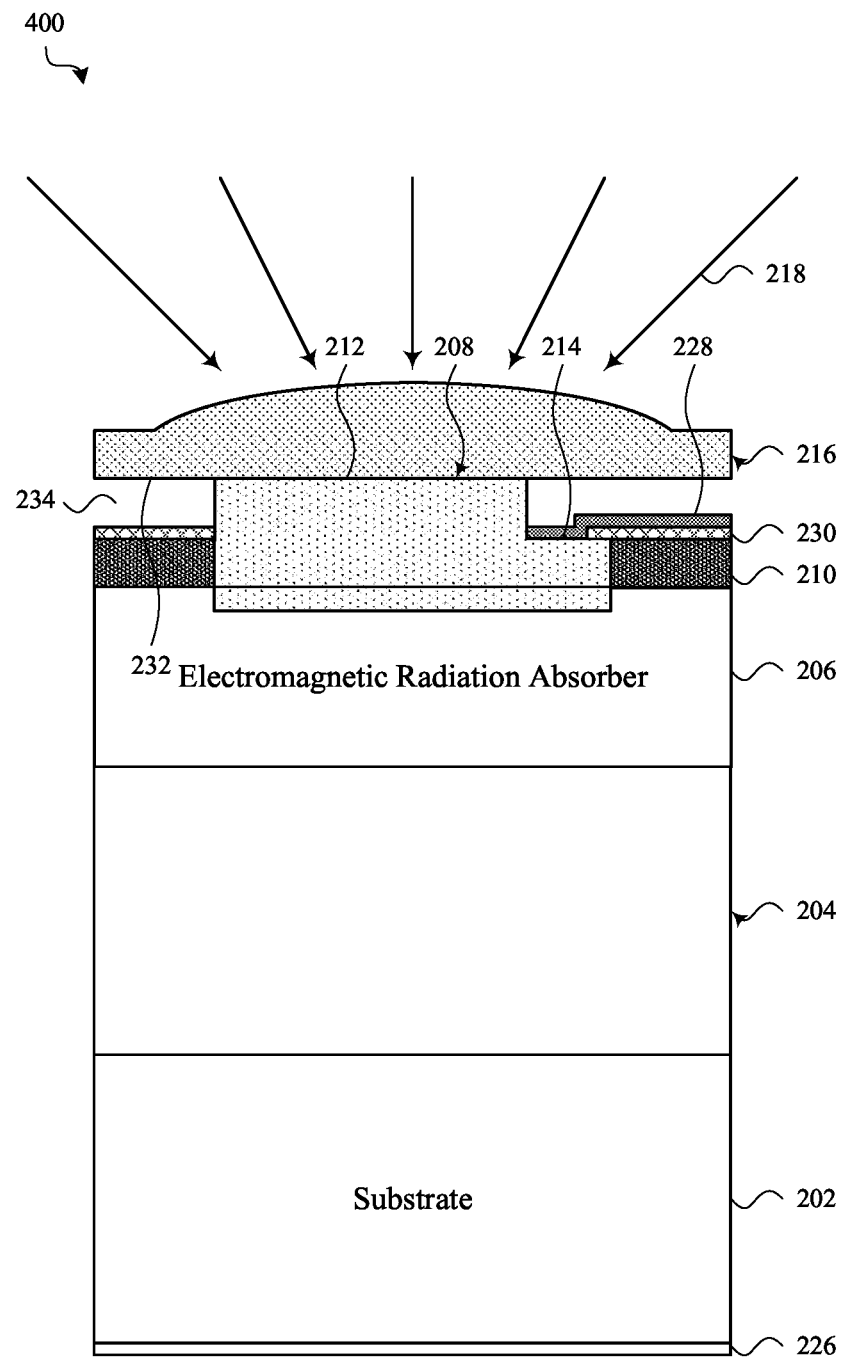
FIG. 4 shows a third example cross-sectional elevation of an FSI electromagnetic radiation detector pixel.

FIG. 4 shows a third example cross-sectional elevation of an FSI electromagnetic radiation detector pixel 400. The detector pixel 400 is an example of the detector pixel described with reference to FIG. 1 and includes much of the structure of the detector pixel described with reference to FIG. 2. In some cases, the detector pixel 400 may be incorporated into an array of detector pixels.

The detector pixel 400 differs from the detector pixel described with reference to FIG. 2 in that it does not include the SiN layer(s) 222 or the $SiO_2$ layer(s) 224.

Figure 5:
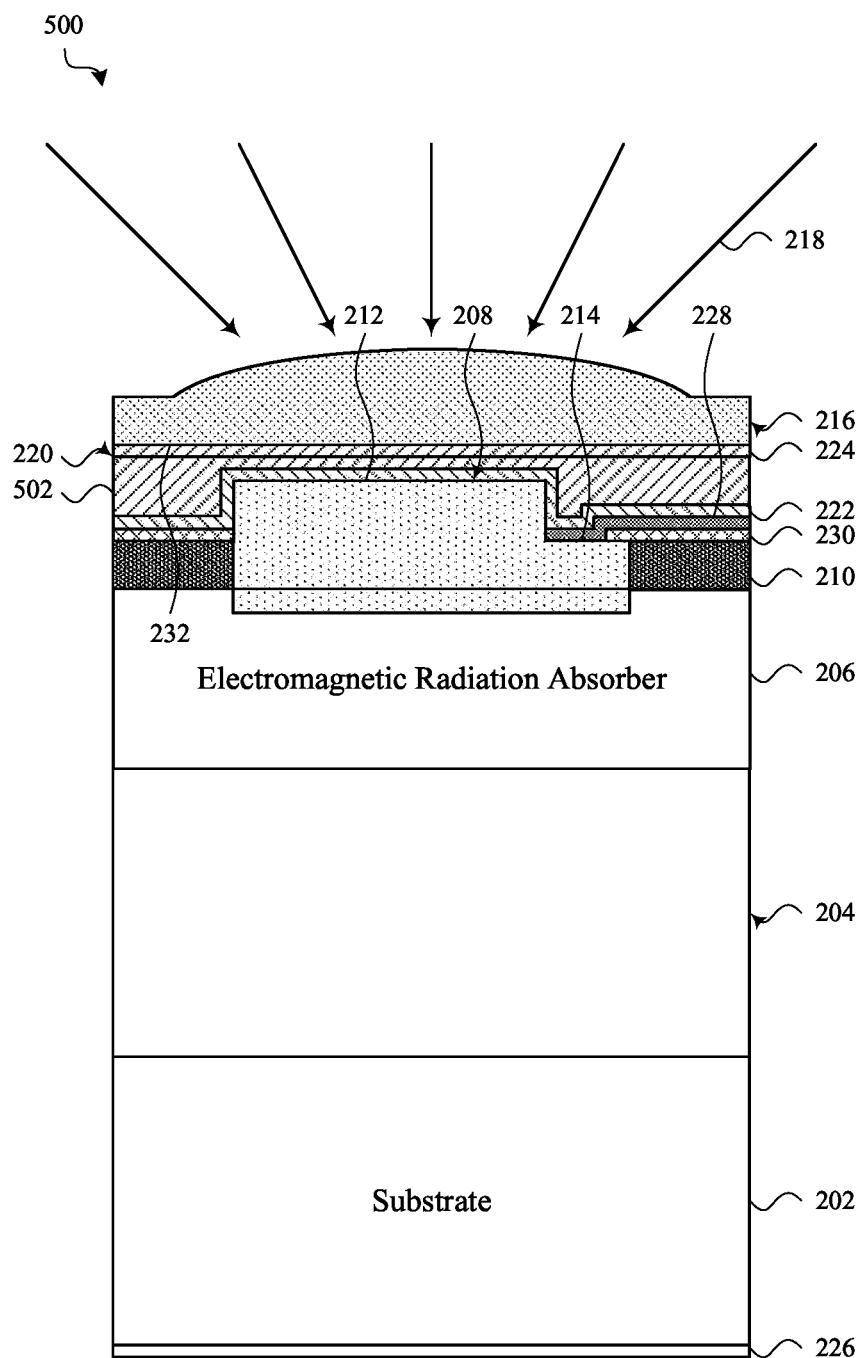
FIG. 5 shows a fourth example cross-sectional elevation of an FSI electromagnetic radiation detector pixel.

FIG. 5 shows a fourth example cross-sectional elevation of an FSI electromagnetic radiation detector pixel 500. The detector pixel 500 is an example of the detector pixel described with reference to FIG. 1 and includes much of the structure of the detector pixel described with reference to FIG. 2. In some cases, the detector pixel 500 may be incorporated into an array of detector pixels.

The detector pixel 500 differs from the detector pixel described with reference to FIG. 2 in that it does not include any of an air gap, another type of gas-filled gap, or a vacuum-filled gap. Instead, the detector pixel 500 includes a fill material 502 (e.g., a $SiO_2$ fill) disposed around a portion of the stepped electrical contact 208. The fill material 502 may in some cases be deposited around and over the stepped electrical contact 208, and then planarized. In some cases, a $SiO_2$ fill material 502 may be planarized so that the total thickness of $SiO_2$ between the first surface 212 of the stepped electrical contact 208 and the lens 216 is 30 nm or less. Alternatively, the total thickness of $SiO_2$ may be between 0 and 100 nm, or in some cases greater than 100 nm.

Although the detector pixel 500 is shown with the set of one or more bond-facilitating layers 220 described with reference to FIG. 2, the bond-facilitating layer(s) 220 may in some cases not include the dielectric 222. In other embodiments, a $SiO_2$ fill material 502 may be planarized to such an extent that there is little or no $SiO_2$ in the set of one or more bond-facilitating layers 220. Thus, the bond-facilitating layer(s) 220 may include $SiO_2$ and SiN, just $SiO_2$, or just SiN.

Figure 6:
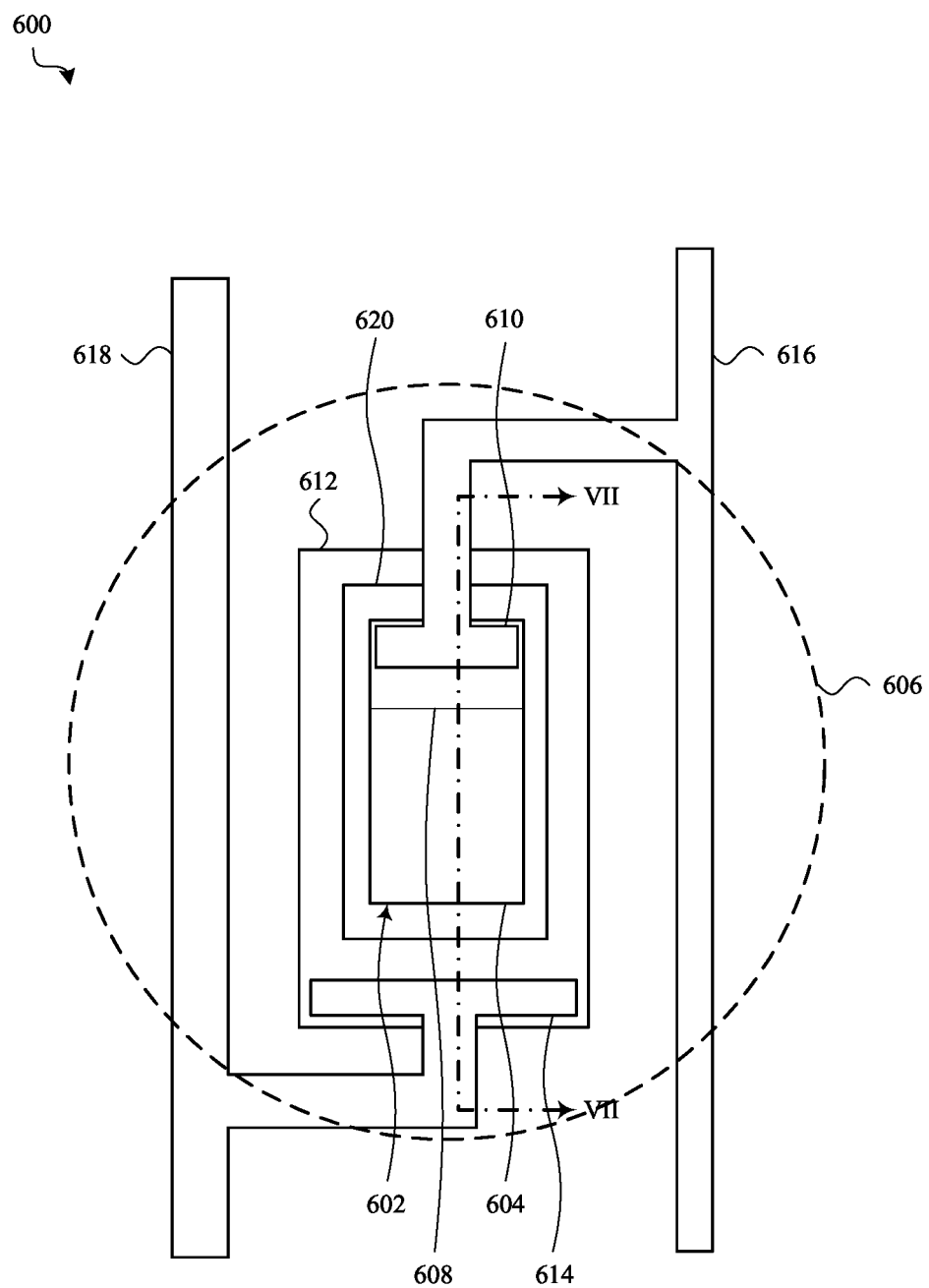
FIG. 6 shows an example plan view of an FSI electromagnetic radiation detector pixel, which detector pixel may be generally constructed as described with reference to any of FIGS. 1-5.

FIG. 6 shows an example plan view of an FSI electromagnetic radiation detector pixel 600, which detector pixel 600 may be generally constructed as described with reference to any of FIGS. 1-5. In particular, FIG. 6 shows a cap layer 620 (of a set of epitaxial layers) in which a stepped electrical contact 602 is formed. The stepped electrical contact 602 includes a first surface 604 that may be directly bonded to a lens 606, and a second surface 608 that may be set back from (i.e., spaced apart from) a bonding surface of the lens 606. An electrode 610 (a conductor) may be electrically connected to the second surface 608 of the stepped electrical contact 602.

Optionally, a guard ring 612 may be formed around and electrically separated from the stepped electrical contact 602. The guard ring 612 may also be set back from (i.e., spaced apart from) the bonding surface of the lens 606. A second electrode 614 (a conductor) may be electrically connected to a surface of the guard ring 612, similarly to how the electrode 610 is electrically connected to the second surface 608 of the stepped electrical contact 602.

In FIG. 6, the electrodes 610 and 614 are shown to be electrically connected to the stepped electrical contact 602 and guard ring 612 near respective, parallel edges of the stepped electrical contact 602 and guard ring 612. Alternatively, the electrodes 610 and 614 could be electrically connected to the stepped electrical contact 602 and guard ring 612 near respective, perpendicularly-oriented edges of the stepped electrical contact 602 and guard ring 612.

Each of the electrodes 610, 614 may be routed between an electromagnetic radiation absorber and the lens 606, and may be spaced apart from the lens 606, as described with reference to the electrodes attached to the stepped electrical contacts in any of FIGS. 1-5. Each of the electrodes 610, 614 may be connected to respective, parallel routing conductors 616, 618 or other types of routing conductors.

By way of example, the lens 606 is shown to have a circular circumference. Alternatively, the circumference of the lens 606 may be oval, square, rectangular, oblong, or otherwise-shaped. Also by way of example, the lens 606 is shown to have a diameter greater than that of the stepped electrical contact 602. In other embodiments, the diameter (or other dimensions) of the lens 606 may be greater or smaller.

In some cases, the detector pixel 600 may be incorporated into an array of detector pixels.

Figure 7:
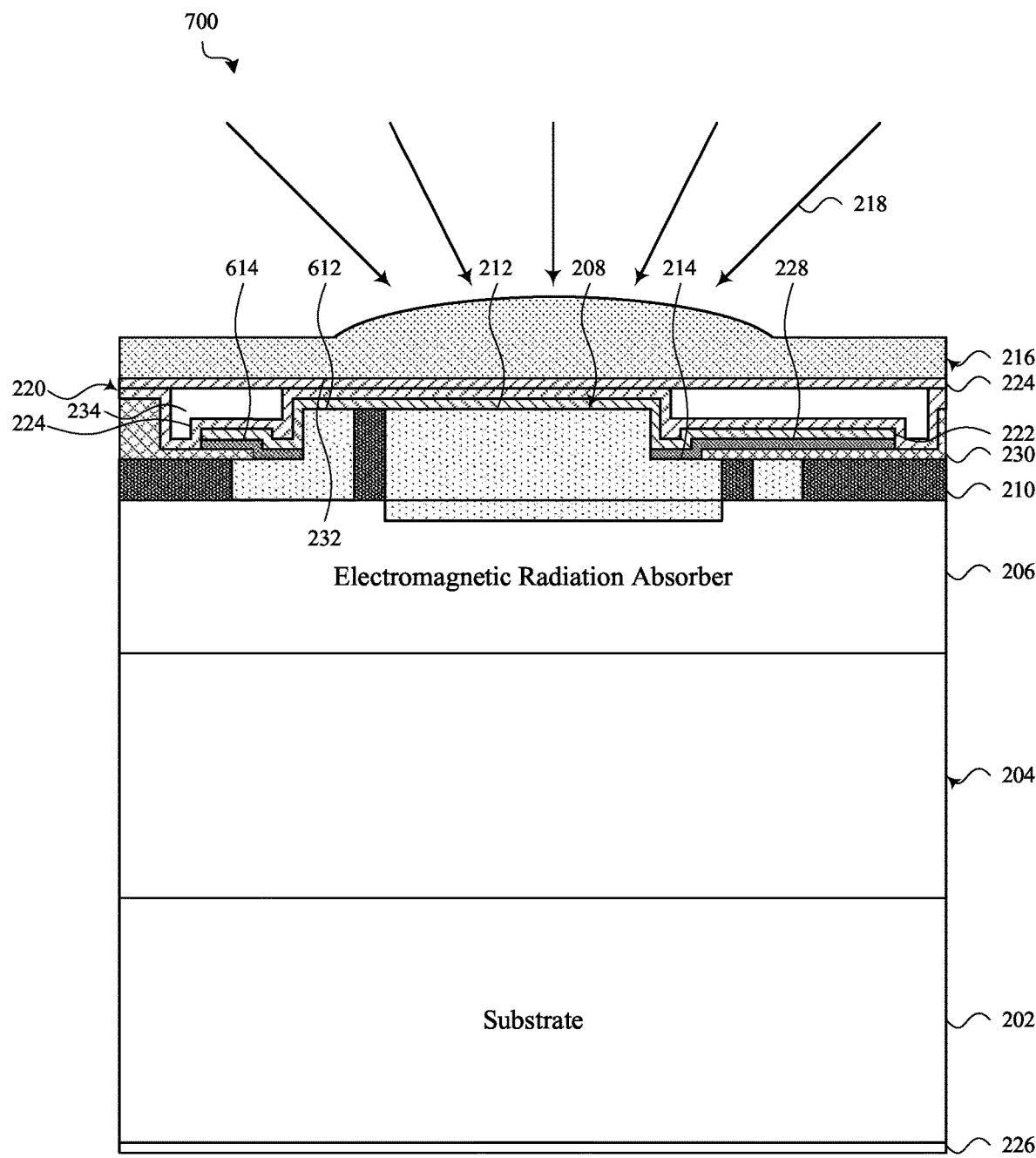
FIG. 7 shows a fifth example cross-sectional elevation of an FSI electromagnetic radiation detector pixel.

FIG. 7 shows a fifth example cross-sectional elevation of an FSI electromagnetic radiation detector pixel 700, with the cross-section being taken along line VII-VII of FIG. 6. The detector pixel 700 is an example of the electromagnetic radiation detector pixel described with reference to FIG. 1 and includes much of the structure of the detector pixel described with reference to FIG. 2. In some cases, the detector pixel 700 may be incorporated into an array of detector pixels.

The detector pixel 700 differs from the detector pixel described with reference to FIG. 2 in that it includes a guard ring 612 and electrode 614 connected thereto, as described with reference to FIG. 6.

The guard ring 612 and electrode 614 structures, as well as any dielectrics or layers deposited thereon or thereunder, may also be incorporated into any of the FSI detector pixels described with reference to FIGS. 3-5.

Figure 8:
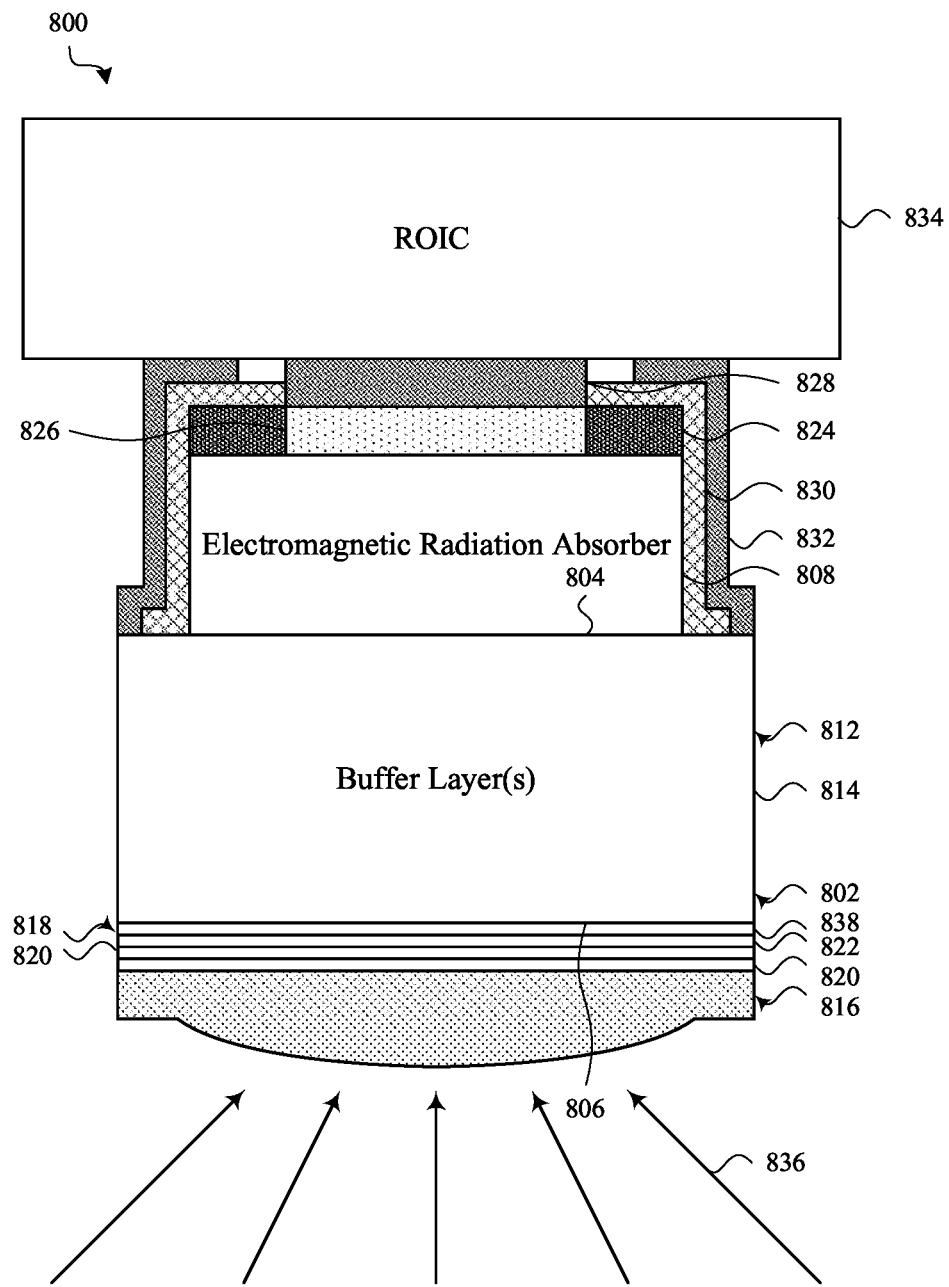
FIG. 8 shows an example cross-sectional elevation of a BSI electromagnetic radiation detector pixel.

FIG. 8 shows an example cross-sectional elevation of a BSI electromagnetic radiation detector pixel 800. The detector pixel 800 is an example of the detector pixel described with reference to FIG. 1. In some cases, the detector pixel 800 may be incorporated into an array of detector pixels.

The detector pixel 800 may include a layered structure 802 having a first side 804 and a second side 806, with the second side 806 opposite the first side 804. An electromagnetic radiation absorber 808 may be grown on the first side 804 of the layered structure 802, and in some cases may be considered a part of the layered structure 802. In some cases, the electromagnetic radiation absorber 808 may include InGaAs (e.g., one or more layers of InGaAs). In some cases, the layered structure 802 may include a substrate (e.g., an InP substrate) on which a set of epitaxial layers 812, including the electromagnetic radiation absorber, is grown. The layered structure 802 may also or alternatively include a set of buffer layers 814 (i.e., one or more buffer layers 814) positioned between the electromagnetic radiation absorber 808 and the substrate. As shown, the substrate, and in some cases some or all of the buffer layer(s) 814, may be removed. Although some of the buffer layer(s) are shown in FIG. 8, all of the buffer layer(s) may be removed in some embodiments.

A lens 816 may be directly bonded to the second side 806 of the layered structure 802. When the layered structure 802 includes the substrate, the lens 816 may be directly bonded to the substrate. However, in embodiments that do not include the substrate (e.g., because the substrate was removed to thin the detector pixel 800), the lens 816 may be directly bonded to a buffer layer in the set of buffer layers 814. In embodiments that do not include the substrate or the set of buffer layers 814 (e.g., because the set of buffer layers 814 was not provided or removed, and because the substrate was removed), the lens 816 may be directly bonded to the electromagnetic radiation absorber 808. The lens 816 may also be bonded to another electromagnetic radiation absorber within the layered structure 802, or to another layer within the layered structure 802.

In some cases, the detector pixel 800 may include an optional etch stop material 838. The etch stop material 838 may aid in removal of a portion of the layered structure 802 (i.e., to aid in thinning of the layered structure 802 by removal of a substrate and/or some or all of the buffer layer(s) 814).

By way of example, the lens 816 may include Si (and in some cases may be formed entirely of Si). In some embodiments, the lens 816 may be formed individually, or as part of a lens array, by etching a Si lens on a Si on insulator (SOI) substrate (wafer), and then removing the SOI substrate. Dry etching, wet etching, and/or gray scale lithography may be used to form a lens 816 with a desired shape. In some cases, the lens 816 may have a thickness of about 100-200 micrometers (μm).

The lens 816 may in some cases be directly bonded to the electromagnetic radiation absorber 808, a buffer layer, or a substrate without any type of intervening layer therebetween. In other cases, the lens 816 may be directly bonded to the electromagnetic radiation absorber 808, buffer layer, or substrate via a set of one or more bond-facilitating layers 818 including one or more layers of $SiO_2$ 820 and/or one or more layers of SiN 822.

In some embodiments, a cap layer 824 (e.g., a layer of InAsP) may be formed on a side of the electromagnetic radiation absorber 808 opposite the layered structure 802. The cap layer 824 may in some cases be an $n^+$ doped material, and a $p^+$ well 826 may be formed in the cap layer 824. A first electrode 828 (a conductor) may be deposited on and electrically connected to the $p^+$ well, and a dielectric 830 may be deposited on at least part of the $n^+$ doped cap layer 824. A second electrode 832 (a conductor) may be routed through or around the dielectric 830 and the electromagnetic radiation absorber 808 and electrically connected to a buffer layer in the set of buffer layers 814 (or to an N-contact layer below the electromagnetic radiation absorber 808).

The first and second electrodes may be electrically connected to corresponding electrodes of a readout integrated circuit 834 (ROIC). The ROIC 834 may include a device layer (e.g., for a transimpedance amplifier (TIA) or other detection/amplification circuit), metal layers for routing electrical signals through a readout circuit, top electrodes (e.g., metal contacts) for electrical interconnection to the electrodes 828, 832, and so on. A function of the ROIC 834 may be to collect the photocurrent generated by the electromagnetic radiation absorber 808, and pass it to an external contact or convert it to a voltage using a TIA and/or another circuit.

The electromagnetic radiation absorber 808 (which may have an $n^-$ doping in some cases) in combination with the $p^+$ well 826 forms a p-n junction. The p-n junction may be reverse-biased by applying a voltage across the electrodes 828, 832.

When the detector pixel 800 is in use, electromagnetic radiation 836 may be received through the lens 816 and propagate through the layered structure 802 to the electromagnetic radiation absorber 808.

An advantage of the BSI electromagnetic radiation detector pixel 800 is that the electrical connections to the electromagnetic radiation absorber 808 and p+ well 826 may be simpler to construct than the electrical connections of the FSI electromagnetic radiation absorbers described with reference to FIGS. 2-7.

Figure 9A:
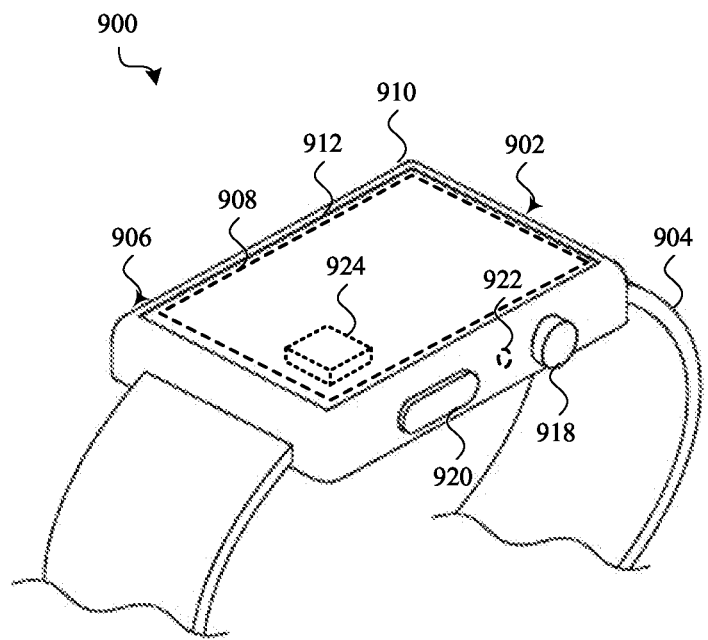
FIGS. 9A and 9B show an example of a device that includes a set of sensors.
Figure 9B:
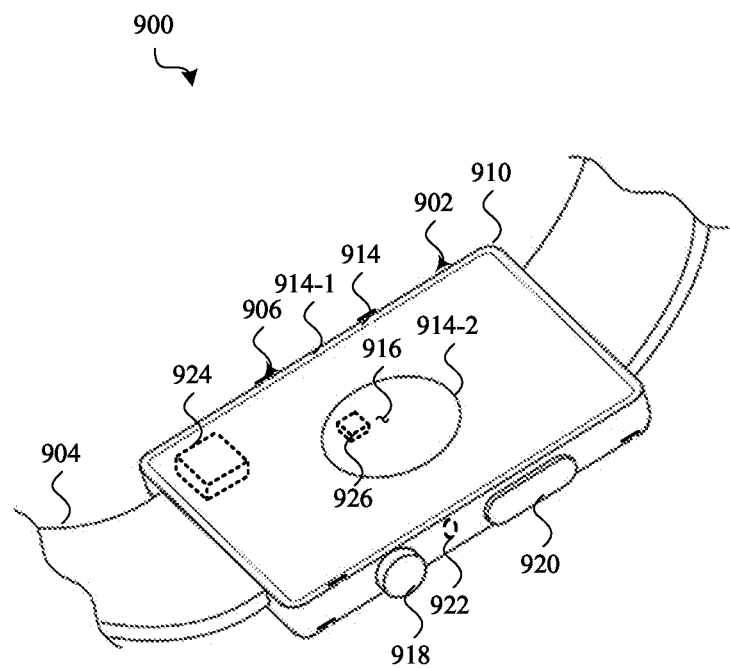

FIGS. 9A and 9B show an example of a device 900 (an electronic device) that includes a set of sensors. The sensors may be used, for example, to acquire biological information from the wearer or user of the device 900 (e.g., a heart rate, respiration rate, blood pressure, blood flow rate, blood oxygenation, blood glucose level, and so on), or to determine a status of the device 900 (e.g., whether the device 900 is being worn or a tightness of the device 900). The device's dimensions and form factor, and inclusion of a band 904 (e.g., a wrist band), suggest that the device 900 is an electronic watch, fitness monitor, or health diagnostic device. However, the device 900 could alternatively be any type of wearable device. FIG. 9A shows a front isometric view of the device 900, and FIG. 9B shows a back isometric view of the device 900.

The device 900 may include a body 902 (e.g., a watch body) and a band 904. The body 902 may include an input or selection device, such as a crown 918 or a button 920. The band 904 may be attached to a housing 906 of the body 902, and may be used to attach the body 902 to a body part (e.g., an arm, wrist, leg, ankle, or waist) of a user. The body 902 may include a housing 906 that at least partially surrounds a display 908. In some embodiments, the housing 906 may include a sidewall 910, which sidewall 910 may support a front cover 912 (FIG. 9A) and/or a back cover 914 (FIG. 9B). The front cover 912 may be positioned over the display 908, and may provide a window through which the display 908 may be viewed. In some embodiments, the display 908 may be attached to (or abut) the sidewall 910 and/or the front cover 912. In alternative embodiments of the device 900, the display 908 may not be included and/or the housing 906 may have an alternative configuration.

The display 908 may include one or more light-emitting elements including, for example, light-emitting elements that define a light-emitting diode (LED) display, organic LED (OLED) display, liquid crystal display (LCD), electroluminescent (EL) display, or other type of display. In some embodiments, the display 908 may include, or be associated with, one or more touch and/or force sensors that are configured to detect a touch and/or a force applied to a surface of the front cover 912.

In some embodiments, the sidewall 910 of the housing 906 may be formed using one or more metals (e.g., aluminum or stainless steel), polymers (e.g., plastics), ceramics, or composites (e.g., carbon fiber). The front cover 912 may be formed, for example, using one or more of glass, a crystal (e.g., sapphire), or a transparent polymer (e.g., plastic) that enables a user to view the display 908 through the front cover 912. In some cases, a portion of the front cover 912 (e.g., a perimeter portion of the front cover 912) may be coated with an opaque ink to obscure components included within the housing 906. In some cases, all of the exterior components of the housing 906 may be formed from a transparent material, and components within the device 900 may or may not be obscured by an opaque ink or opaque structure within the housing 906.

The back cover 914 may be formed using the same material(s) that are used to form the sidewall 910 or the front cover 912. In some cases, the back cover 914 may be part of a monolithic element that also forms the sidewall 910. In other cases, and as shown, the back cover 914 may be a multi-part back cover, such as a back cover having a first back cover portion 914-1 attached to the sidewall 910 and a second back cover portion 914-2 attached to the first back cover portion 914-1. The second back cover portion 914-2 may in some cases have a circular perimeter and an arcuate exterior surface 916 (i.e., an exterior surface 916 having an arcuate profile).

The front cover 912, back cover 914, or first back cover portion 914-1 may be mounted to the sidewall 910 using fasteners, adhesives, seals, gaskets, or other components. The second back cover portion 914-2, when present, may be mounted to the first back cover portion 914-1 using fasteners, adhesives, seals, gaskets, or other components.

A display stack or device stack (hereafter referred to as a "stack") including the display 908 may be attached (or abutted) to an interior surface of the front cover 912 and extend into an interior volume of the device 900. In some cases, the stack may include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 912 (e.g., to a display surface of the device 900).

In some cases, a force sensor (or part of a force sensor system) may be positioned within the interior volume below and/or to the side of the display 908 (and in some cases within the device stack). The force sensor (or force sensor system) may be triggered in response to the touch sensor detecting one or more touches on the front cover 912 (or a location or locations of one or more touches on the front cover 912), and may determine an amount of force associated with each touch, or an amount of force associated with the collection of touches as a whole. The force sensor (or force sensor system) may alternatively trigger operation of the touch sensor (or touch sensor system), or may be used independently of the touch sensor (or touch sensor system).

The device 900 may include various sensors. In some embodiments, the device 900 may have a port 922 (or set of ports) on a side of the housing 906 (or elsewhere), and an ambient pressure sensor, ambient temperature sensor, internal/external differential pressure sensor, gas sensor, particulate matter concentration sensor, or air quality sensor may be positioned in or near the port(s) 922.

In some cases, one or more skin-facing sensors 926 may be included within the device 900. The skin-facing sensor(s) 926 may emit or transmit signals through the housing 906 (or back cover 914) and/or receive signals or sense conditions through the housing 906 (or back cover 914). For example, in some embodiments, one or more such sensors may include a number of electromagnetic radiation emitters (e.g., visible light and/or IR emitters) and/or a number of electromagnetic radiation detectors (e.g., visible light and/or IR detectors, such as electromagnetic radiation detectors including any of the detector pixels described herein). The sensors may be used, for example, to acquire biological information from the wearer or user of the device 900 (e.g., a heart rate, respiration rate, blood pressure, blood flow rate, blood oxygenation, blood glucose level, and so on), or to determine a status of the device 900 (e.g., whether the device 900 is being worn or a tightness of the device 900).

The device 900 may include circuitry 924 (e.g., a processor and/or other components) configured to determine or extract, at least partly in response to signals received directly or indirectly from one or more of the device's sensors, biological parameters of the device's user and/or a status of the device 900, for example. In some embodiments, the circuitry 924 may be configured to convey the determined or extracted parameters or statuses via an output device of the device 900. For example, the circuitry 924 may cause the indication(s) to be displayed on the display 908, indicated via audio or haptic outputs, transmitted via a wireless communications interface or other communications interface, and so on. The circuitry 924 may also or alternatively maintain or alter one or more settings, functions, or aspects of the device 900, including, in some cases, what is displayed on the display 908.

Figure 10A:
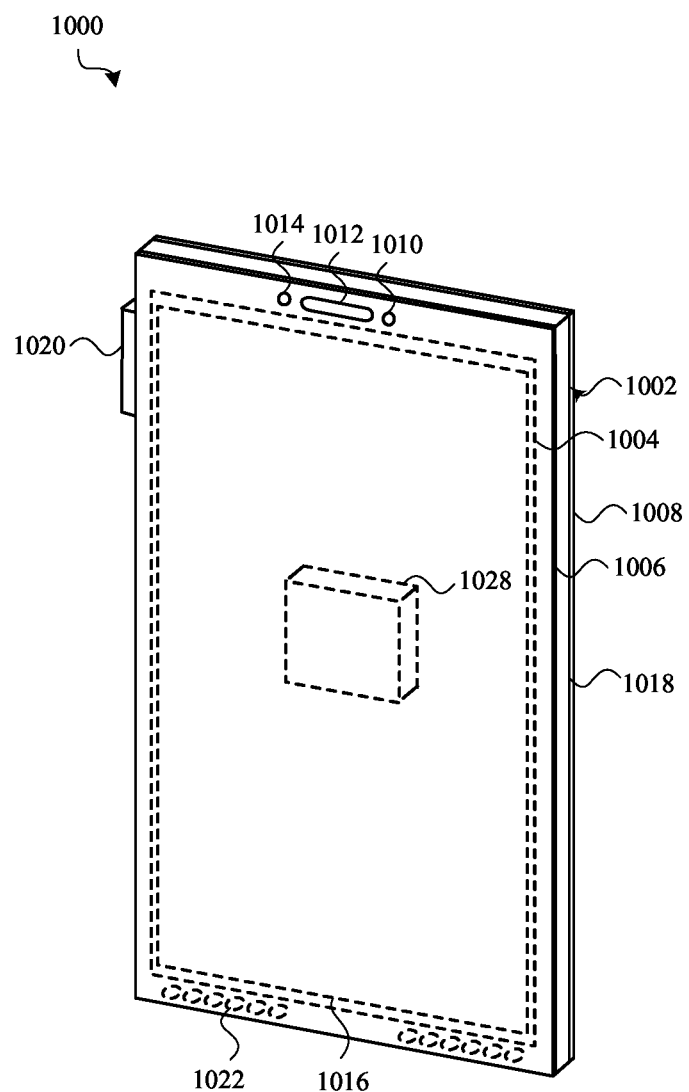
FIGS. 10A and 10B show another example of a device that includes a set of sensors.
Figure 10B:
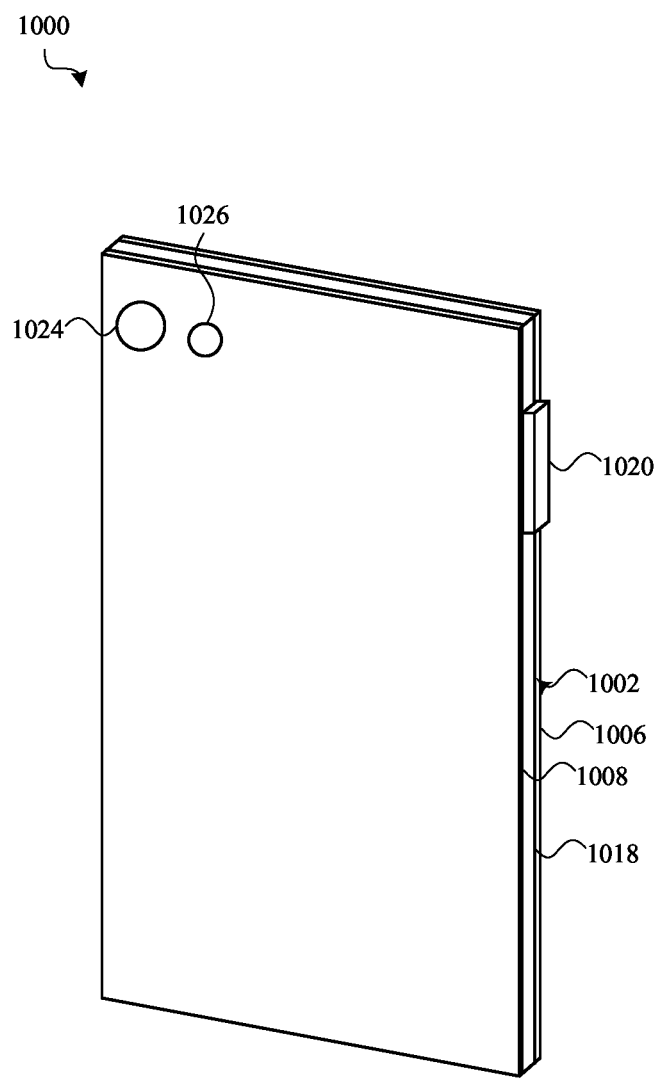

FIGS. 10A and 10B show another example of a device 1000 (an electronic device) that includes a set of sensors. The sensors may be used, for example, to acquire biological information from the user of the device 1000, to determine parameters of an environment of the device 1000 (e.g., air quality), or to determine a distance to or composition of a target or object. The device's dimensions and form factor, including the ratio of the length of its long sides to the length of its short sides, suggest that the device 1000 is a mobile phone (e.g., a smartphone). However, the device's dimensions and form factor are arbitrarily chosen, and the device 1000 could alternatively be any portable electronic device including, for example a mobile phone, tablet computer, portable computer, portable music player, portable terminal, vehicle navigation system, robot navigation system, or other portable or mobile device. The device 1000 could also be a device that is semi-permanently located (or installed) at a single location (e.g., a door lock, thermostat, refrigerator, or other appliance). FIG. 10A shows a front isometric view of the device 1000, and FIG. 10B shows a rear isometric view of the device 1000. The device 1000 may include a housing 1002 that at least partially surrounds a display 1004. The housing 1002 may include or support a front cover 1006 or a rear cover 1008. The front cover 1006 may be positioned over the display 1004, and may provide a window through which the display 1004 (including images displayed thereon) may be viewed by a user. In some embodiments, the display 1004 may be attached to (or abut) the housing 1002 and/or the front cover 1006.

The display 1004 may include one or more light-emitting elements or pixels, and in some cases may be an LED display, an OLED display, an LCD, an EL display, a laser projector, or another type of electronic display. In some embodiments, the display 1004 may include, or be associated with, one or more touch and/or force sensors that are configured to detect a touch and/or a force applied to a surface of the front cover 1006.

The various components of the housing 1002 may be formed from the same or different materials. For example, a sidewall 1018 of the housing 1002 may be formed using one or more metals (e.g., stainless steel), polymers (e.g., plastics), ceramics, or composites (e.g., carbon fiber). In some cases, the sidewall 1018 may be a multi-segment sidewall including a set of antennas. The antennas may form structural components of the sidewall 1018. The antennas may be structurally coupled (to one another or to other components) and electrically isolated (from each other or from other components) by one or more non-conductive segments of the sidewall 1018. The front cover 1006 may be formed, for example, using one or more of glass, a crystal (e.g., sapphire), or a transparent polymer (e.g., plastic) that enables a user to view the display 1004 through the front cover 1006. In some cases, a portion of the front cover 1006 (e.g., a perimeter portion of the front cover 1006) may be coated with an opaque ink to obscure components included within the housing 1002. The rear cover 1008 may be formed using the same material(s) that are used to form the sidewall 1018 or the front cover 1006, or may be formed using a different material or materials. In some cases, the rear cover 1008 may be part of a monolithic element that also forms the sidewall 1018 (or in cases where the sidewall 1018 is a multi-segment sidewall, those portions of the sidewall 1018 that are non-conductive). In still other embodiments, all of the exterior components of the housing 1002 may be formed from a transparent material, and components within the device 1000 may or may not be obscured by an opaque ink or opaque structure within the housing 1002.

The front cover 1006 may be mounted to the sidewall 1018 to cover an opening defined by the sidewall 1018 (i.e., an opening into an interior volume in which various electronic components of the device 1000, including the display 1004, may be positioned). The front cover 1006 may be mounted to the sidewall 1018 using fasteners, adhesives, seals, gaskets, or other components.

A display stack or device stack (hereafter referred to as a "stack") including the display 1004 (and in some cases the front cover 1006) may be attached (or abutted) to an interior surface of the front cover 1006 and extend into the interior volume of the device 1000. In some cases, the stack may also include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 1006 (e.g., to a display surface of the device 1000).

The stack may also include one or an array of sensors 1016, with the sensors positioned in front of or behind, or interspersed with, the light-emitting elements of the display 1004. In some cases, an array of sensors 1016 may extend across an area equal in size to the area of the display 1004. Alternatively, the array of sensors 1016 may extend across an area that is smaller than or greater than the area of the display 1004, or may be positioned entirely adjacent the display 1004. Although the array of sensors 1016 is shown to have a rectangular boundary, the array could alternatively have a boundary with a different shape, including, for example, an irregular shape. The array of sensors 1016 may be variously configured as an ambient light sensor, a light-emitting element (e.g., OLED) health sensor (e.g., age sensor), a touch sensor, a proximity sensor, a health sensor, a biometric sensor (e.g., a fingerprint sensor or facial recognition sensor), a camera, a depth sensor, and so on. The array of sensors 1016 may also or alternatively function as a proximity sensor, for determining whether an object (e.g., a finger, face, or stylus) is proximate to the front cover 1006. In some embodiments, the array of sensors 1016 may provide the touch sensing capability (i.e., touch sensor) of the stack.

In some cases, a force sensor (or part of a force sensor system) may be positioned within the interior volume below and/or to the side of the display 1004 (and in some cases within the stack). The force sensor (or force sensor system) may be triggered in response to the touch sensor detecting one or more touches on the front cover 1006 (or indicating a location or locations of one or more touches on the front cover 1006), and may determine an amount of force associated with each touch, or an amount of force associated with the collection of touches as a whole.

As shown primarily in FIG. 10A, the device 1000 may include various other components. For example, the front of the device 1000 may include one or more front-facing cameras 1010 (including one or more image sensors), speakers 1012, microphones, or other components 1014 (e.g., audio, imaging, and/or sensing components) that are configured to transmit or receive signals to/from the device 1000. In some cases, a front-facing camera 1010, alone or in combination with other sensors, may be configured to operate as a bio-authentication or facial recognition sensor. Additionally or alternatively, the array of sensors 1016 may be configured to operate as a front-facing camera 1010, a bio-authentication sensor, or a facial recognition sensor.

The device 1000 may also include buttons or other input devices positioned along the sidewall 1018 and/or on a rear surface of the device 1000. For example, a volume button or multipurpose button 1020 may be positioned along the sidewall 1018, and in some cases may extend through an aperture in the sidewall 1018. The sidewall 1018 may include one or more ports 1022 that allow air, but not liquids, to flow into and out of the device 1000. In some embodiments, one or more sensors may be positioned in or near the port(s) 1022. For example, an ambient pressure sensor, ambient temperature sensor, internal/external differential pressure sensor, gas sensor, particulate matter concentration sensor, or air quality sensor may be positioned in or near a port 1022.

In some embodiments, the rear surface of the device 1000 may include a rear-facing camera 1024. A flash or light source 1026 may also be positioned along the rear of the device 1000 (e.g., near the rear-facing camera). In some cases, the rear surface of the device 1000 may include multiple rear-facing cameras.

In some cases, the sensor(s) 1016, the front-facing camera 1010, the rear-facing camera 1024, and/or other sensors positioned on the front, back, or sides of the device 1000 may emit or transmit signals through the housing 1002 (including the front cover 1006, rear cover 1008, or sidewall 1018) and/or receive signals or sense conditions through the housing 1002. For example, in some embodiments, one or more such sensors may include a number of electromagnetic radiation emitters (e.g., visible light and/or IR emitters) and/or a number of electromagnetic radiation detectors (e.g., visible light and/or IR detectors, such as electromagnetic radiation detectors including any of the detector pixels described herein).

The device 1000 may include circuitry 1028 (e.g., a processor and/or other components) configured to determine or extract, at least partly in response to signals received directly or indirectly from one or more of the device's sensors, biological parameters of the device's user, a status of the device 1000, parameters of an environment of the device 1000 (e.g., air quality), or a composition of a target or object, for example. In some embodiments, the circuitry 1028 may be configured to convey the determined or extracted parameters or statuses via an output device of the device 1000. For example, the circuitry 1028 may cause the indication(s) to be displayed on the display 1004, indicated via audio or haptic outputs, transmitted via a wireless communications interface or other communications interface, and so on. The circuitry 1028 may also or alternatively maintain or alter one or more settings, functions, or aspects of the device 1000, including, in some cases, what is displayed on the display 1004.

Figure 11:
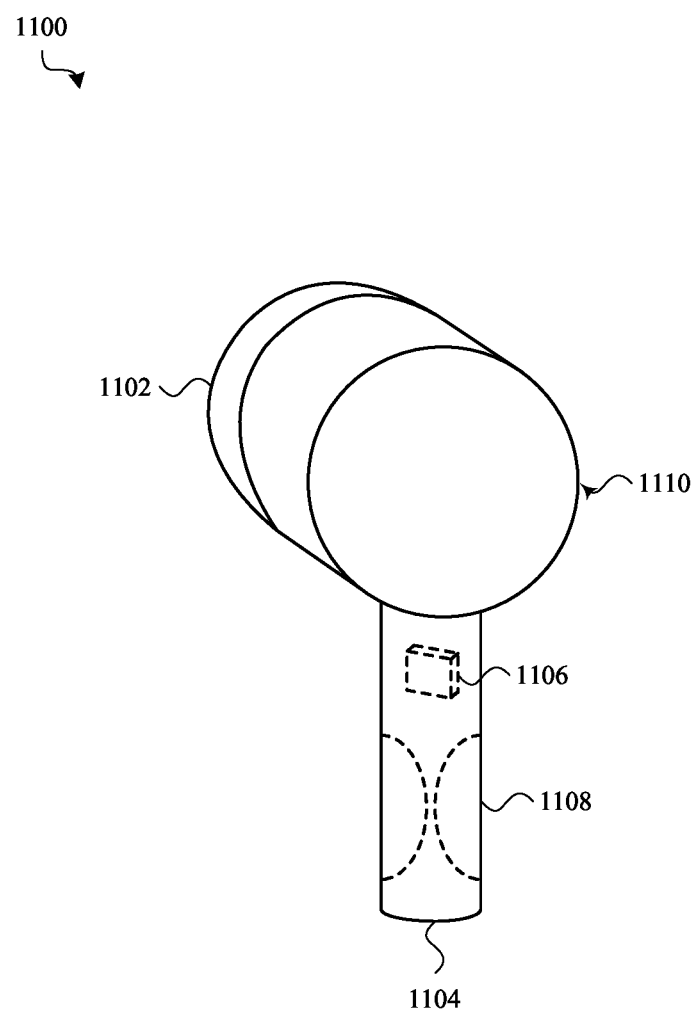
FIG. 11 shows an example of an earbud that includes a set of sensors.

FIG. 11 shows an example of an earbud 1100 (an electronic device) that includes a set of sensors 1108. The earbud 1100 may include a housing 1110. The housing 1110 may hold a speaker 1102 that can be inserted into a user's ear, an optional microphone 1104, and circuitry 1106 that can be used to acquire audio from the microphone 1104, transmit audio to the speaker 1102, and communicate audio between the speaker 1102, the microphone 1104, and one or more remote devices. The circuitry 1106 may communicate with a remote device wirelessly (e.g., via a wireless communications interface, using a Wi-Fi, BLUETOOTH®, or cellular radio communications protocol, for example) or via one or more wires (e.g., via a wired communications interface, such as a Universal Serial Bus (USB) communications interface). In addition to communicating audio, the circuitry 1106 may transmit or receive instructions and so on.

The sensors 1108 may be used, for example, to determine a proximity of a user to the earbud 1100 or speaker 1102, or to receive input from a user. In some cases, a sensor may be used to identify a gesture of a user (e.g., a swipe gesture or a press gesture) made on a surface of the earbud 1100 or in free space in proximity to the earbud 1100. The sensors 1108 may include skin-facing and/or non-skin-facing sensors. In some embodiments, one or more such sensors may include a number of electromagnetic radiation emitters (e.g., visible light and/or IR emitters) and/or a number of electromagnetic radiation detectors (e.g., visible light and/or IR detectors, such electromagnetic radiation detectors including any of the detector pixels described herein).

The circuitry 1106 may include a processor and/or other components that are configured to determine or extract, at least partly in response to signals received directly or indirectly from one or more of the sensors 1108, information related to a proximity of a user, an input of a user, and so on. In some embodiments, the circuitry 1106 may be configured to convey the determined or extracted parameters or statuses via an output device of the earbud 1100. For example, the circuitry 1106 may cause the indication(s) to be output via the speaker 1102 or a haptic device, transmitted via a wireless communications interface or other communications interface, and so on. The circuitry 1106 may also or alternatively maintain or alter one or more settings, functions, or aspects of the earbud 1100, including, in some cases, what is output via the speaker 1102.

Figure 12:
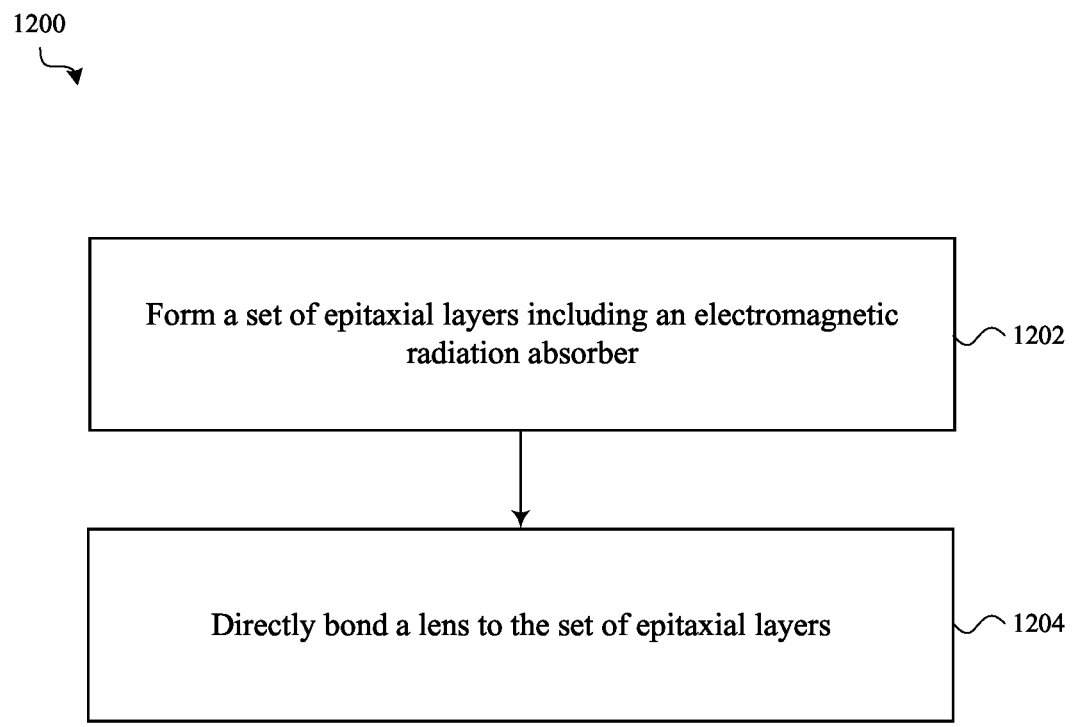
FIG. 12 shows an example method of making an FSI electromagnetic radiation detector pixel.

FIG. 12 shows an example method 1200 of making an FSI electromagnetic radiation detector pixel.

At block 1202, the method 1200 may include forming a set of epitaxial layers including an electromagnetic radiation absorber.

At block 1204, the method 1200 may include directly bonding a lens to the set of epitaxial layers. In some cases, the lens may be directly bonded to a stepped electrical contact formed in the set of epitaxial layers. In some cases, the lens may be directly bonded to the set of epitaxial layers, or stepped electrical contact, by a set of bond-facilitating layers disposed between the set of epitaxial layers and the lens.

Figure 13:
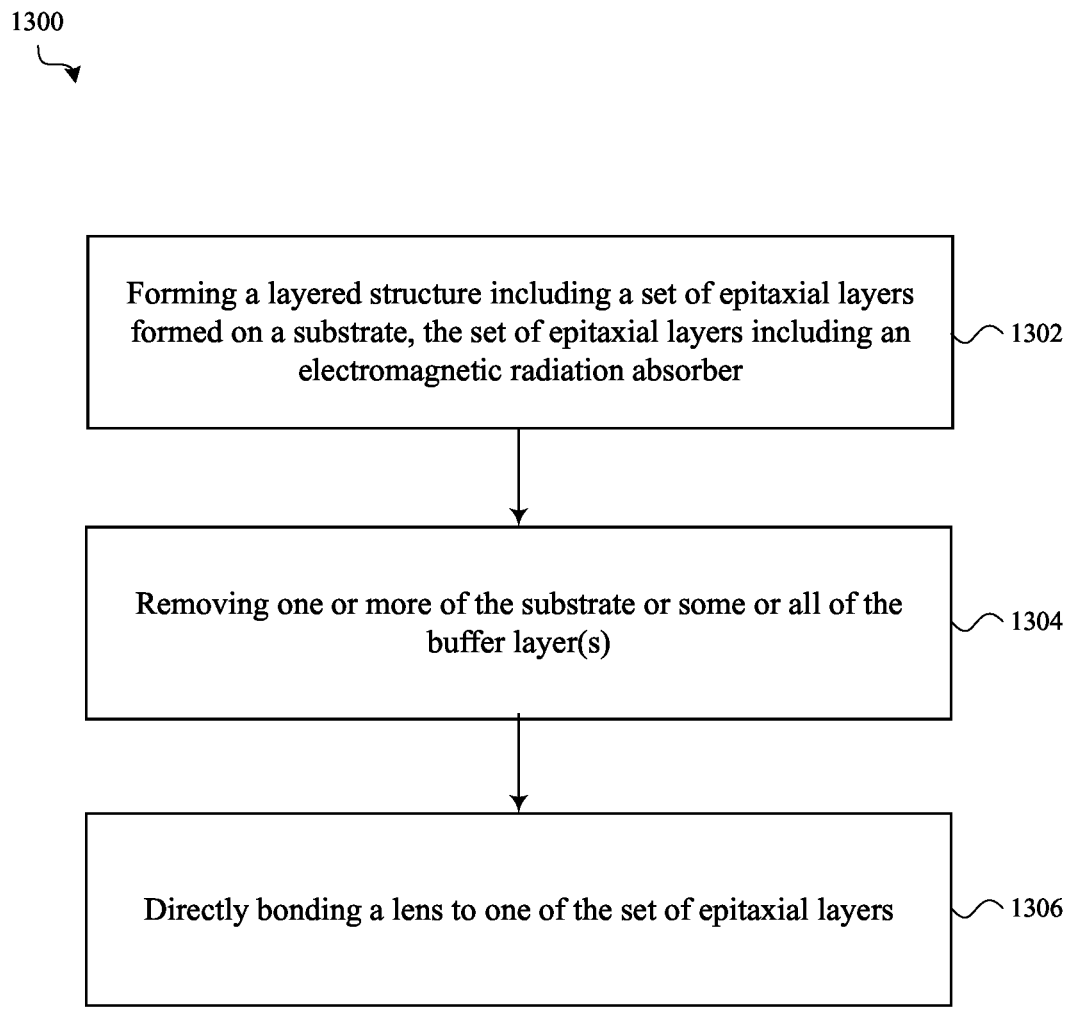
FIG. 13 shows an example method of making a BSI electromagnetic radiation detector pixel.

FIG. 13 shows an example method 1300 of making a BSI electromagnetic radiation detector pixel.

At block 1302, the method 1300 may include forming a layered structure. The layered structure may include a set of epitaxial layers formed on a substrate. The set of epitaxial layers may include an electromagnetic radiation absorber, and in some cases may include a set of one or more buffer layers for transitioning a first lattice constant of the substrate to a second lattice constant of the electromagnetic radiation absorber.

At block 1304, the method 1300 may include removing one or more of the substrate or some or all of the buffer layer(s) from the layered structure.

At block 1306, the method 1300 may include directly bonding a lens to an epitaxial layer in the set of epitaxial layers. The epitaxial layer to which the lens is bonded may in some cases be one of the buffer layers or the electromagnetic radiation absorber. In some cases, the lens may be bonded to the epitaxial layer by a set of bond-facilitating layers disposed between the lens and the epitaxial layer.

Figure 14:
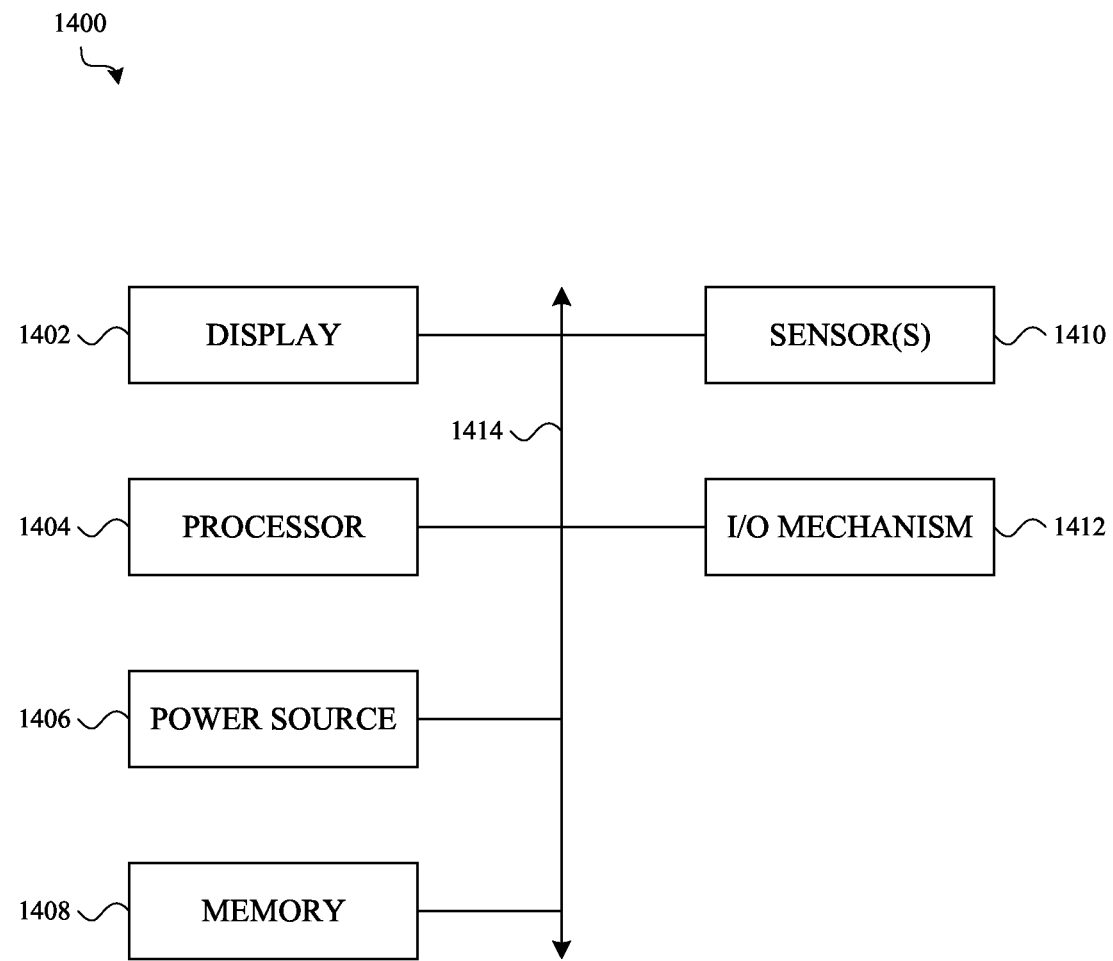
FIG. 14 shows a sample electrical block diagram of an electronic device.

FIG. 14 shows a sample electrical block diagram of an electronic device 1400, which electronic device may in some cases be the device described with reference to FIGS. 9A-9B, 10A-10B, or 11. The electronic device 1400 may include an optional electronic display 1402 (e.g., a light-emitting display), a processor 1404, a power source 1406, a memory 1408 or storage device, a sensor system 1410, or an input/output (I/O) mechanism 1412 (e.g., an input/output device, input/output port, or haptic input/output interface). The processor 1404 may control some or all of the operations of the electronic device 1400. The processor 1404 may communicate, either directly or indirectly, with some or all of the other components of the electronic device 1400. For example, a system bus or other communication mechanism 1414 can provide communication between the electronic display 1402, the processor 1404, the power source 1406, the memory 1408, the sensor system 1410, and the I/O mechanism 1412.

The processor 1404 may be implemented as any electronic device capable of processing, receiving, or transmitting data or instructions, whether such data or instructions is in the form of software or firmware or otherwise encoded. For example, the processor 1404 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements. In some cases, the processor 1404 may provide part or all of the circuitry described with reference to FIGS. 9A-11.

It should be noted that the components of the electronic device 1400 can be controlled by multiple processors. For example, select components of the electronic device 1400 (e.g., the sensor system 1410) may be controlled by a first processor and other components of the electronic device 1400 (e.g., the electronic display 1402) may be controlled by a second processor, where the first and second processors may or may not be in communication with each other.

The power source 1406 can be implemented with any device capable of providing energy to the electronic device 1400. For example, the power source 1406 may include one or more batteries or rechargeable batteries. Additionally or alternatively, the power source 1406 may include a power connector or power cord that connects the electronic device 1400 to another power source, such as a wall outlet.

The memory 1408 may store electronic data that can be used by the electronic device 1400. For example, the memory 1408 may store electrical data or content such as, for example, audio and video files, documents and applications, device settings and user preferences, timing signals, control signals, and data structures or databases. The memory 1408 may include any type of memory. By way of example only, the memory 1408 may include random access memory, read-only memory, Flash memory, removable memory, other types of storage elements, or combinations of such memory types.

The electronic device 1400 may also include a sensor system 1410, including sensors positioned almost anywhere on the electronic device 1400. In some cases, the sensor system 1410 may include one or more electromagnetic radiation emitters and/or detectors, positioned and/or configured as described with reference to any of FIGS. 1-13. The sensor system 1410 may be configured to sense one or more type of parameters, such as but not limited to, vibration; light; touch; force; heat; movement; relative motion; biometric data (e.g., biological parameters) of a user; air quality; proximity; position; connectedness; matter type; and so on. By way of example, the sensor system 1410 may include one or more of (or multiple of) a heat sensor, a position sensor, a proximity sensor, a light or optical sensor (e.g., an electromagnetic radiation emitter and/or detector), an accelerometer, a pressure transducer, a gyroscope, a magnetometer, a health monitoring sensor, and an air quality sensor, and so on. Additionally, the sensor system 1410 may utilize any suitable sensing technology, including, but not limited to, interferometric, magnetic, pressure, capacitive, ultrasonic, resistive, optical, acoustic, piezoelectric, or thermal technologies.

The I/O mechanism 1412 may transmit or receive data from a user or another electronic device. The I/O mechanism 1412 may include the electronic display 1402, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 1412 may transmit electronic signals via a communications interface, such as a wireless, wired, and/or optical communications interface. Examples of wireless and wired communications interfaces include, but are not limited to, cellular and Wi-Fi communications interfaces.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

As described above, one aspect of the present technology may be the gathering and use of data available from various sources. The present disclosure contemplates that, in some instances, this gathered data may include personal information data (e.g., biological information) that uniquely identifies or can be used to identify, locate, contact, or diagnose a specific person. Such personal information data can include demographic data, location-based data, telephone numbers, email addresses, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to activate or deactivate various functions of the user's device, or gather performance metrics for the user's device or the user. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States (US), collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users may selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

What is claimed is:

1. An electromagnetic radiation detector pixel, comprising:
   a set of epitaxial layers defining,
      an electromagnetic radiation absorber; and
      a stepped electrical contact on the electromagnetic radiation absorber;
   a lens directly bonded to the set of epitaxial layers; and
   a conductor; wherein,
      the stepped electrical contact has a first surface at a first distance from the lens and a second surface at a second distance from the lens, the second distance greater than the first distance;
      the lens is directly bonded to the first surface; and
      the conductor is electrically connected to the second surface and spaced apart from the lens.

2. The electromagnetic radiation detector pixel of claim 1, further comprising a set of one or more bond-facilitating layers disposed between the set of epitaxial layers and the lens.

3. The electromagnetic radiation detector pixel of claim 2, wherein the set of one or more bond-facilitating layers comprises a layer of silicon dioxide ($SiO_2$).

4. The electromagnetic radiation detector pixel of claim 2, wherein the set of one or more bond-facilitating layers comprises a layer of silicon nitride (SiN).

5. The electromagnetic radiation detector pixel of claim 2, wherein the set of one or more bond-facilitating layers comprises:
   a layer of silicon nitride (SiN); and
   a layer of silicon dioxide ($SiO_2$).

6. The electromagnetic radiation detector pixel of claim 1, wherein:
   the electromagnetic radiation absorber comprises indium gallium arsenide (InGaAs); and
   the lens comprises silicon (Si).

7. The electromagnetic radiation detector pixel of claim 1, further comprising an air gap between the conductor and the lens.

8. The electromagnetic radiation detector pixel of claim 1, further comprising a silicon dioxide ($SiO_2$) fill material disposed around a portion of the stepped electrical contact, and disposed between the conductor and the lens.

9. The electromagnetic radiation detector pixel of claim 1, further comprising a dielectric disposed between a portion of the conductor and a portion of the set of epitaxial layers.

10. The electromagnetic radiation detector pixel of claim 9, wherein the dielectric comprises a first dielectric, the electromagnetic radiation detector pixel further comprising:
    a second dielectric disposed on the conductor, with at least a portion of the conductor between the first dielectric and the second dielectric; and
    a silicon dioxide ($SiO_2$) fill material disposed around a portion of the stepped electrical contact, and disposed between the second dielectric and the lens.

11. The electromagnetic radiation detector pixel of claim 1, wherein the set of epitaxial layers comprises at least one buffer layer disposed on a side of the electromagnetic radiation absorber opposite the stepped electrical contact.

12. A front-side illumination (FSI) electromagnetic radiation detector pixel, comprising:
    an indium gallium arsenide (InGaAs) electromagnetic radiation absorber;
    a stepped electrical contact on the InGaAs electromagnetic radiation absorber, the stepped electrical contact having a first surface offset from a second surface, the first surface and the second surface facing a same direction;
    a silicon (Si) lens directly bonded to the first surface;
    a set of one or more bond-facilitating layers disposed between the first surface and the Si lens, the set of one or more bond-facilitating layers including silicon dioxide ($SiO_2$); and
    a conductor disposed between the InGaAs electromagnetic radiation absorber and the SI lens and in electrical contact with the stepped electrical contact.

13. The FSI electromagnetic radiation detector pixel of claim 12, further comprising an air gap between the conductor and the Si lens.

14. The FSI electromagnetic radiation detector pixel of claim 12, further comprising a planarized silicon dioxide ($SiO_2$) fill between the conductor and the Si lens.

* * * * *